US012690337B2

(12) United States Patent
Lim et al.

(10) Patent No.: US 12,690,337 B2
(45) Date of Patent: Jul. 21, 2026

(54) TRANSPARENT DISPLAY APPARATUS AND MANUFACTURING METHOD OF THE SAME

(71) Applicant: LG Display Co., Ltd., Seoul (KR)

(72) Inventors: Heetae Lim, Paju-si (KR); Kyoungji Bae, Paju-si (KR); Jinah Kwak, Paju-si (KR); Eunsol Jeon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 379 days.

(21) Appl. No.: 18/485,038

(22) Filed: Oct. 11, 2023

(65) Prior Publication Data

US 2024/0224607 A1 Jul. 4, 2024

(30) Foreign Application Priority Data

Dec. 29, 2022 (KR) ........................ 10-2022-0189067

(51) Int. Cl.
*H10K 59/122* (2023.01)
*H10K 59/12* (2023.01)

(52) U.S. Cl.
CPC ....... *H10K 59/122* (2023.02); *H10K 59/1201* (2023.02)

(58) Field of Classification Search
CPC .. H10K 59/122; H10K 59/1201; H10K 71/00; H10K 59/1213; H10K 50/805; H10K 59/124; H10K 71/10; H10K 71/231
See application file for complete search history.

(56) References Cited

U.S. PATENT DOCUMENTS

| | | | |
|---|---|---|---|
| 7,510,885 | B2 | 3/2009 | Halls et al. |
| 8,963,815 | B2 | 2/2015 | Park |
| 11,251,241 | B2 | 2/2022 | Hou |
| 11,825,693 | B2 | 11/2023 | Youn et al. |
| 11,839,108 | B2 | 12/2023 | Youn et al. |

(Continued)

FOREIGN PATENT DOCUMENTS

| | | |
|---|---|---|
| CN | 114695445 A | 7/2022 |
| JP | 2006-511073 A | 3/2006 |

(Continued)

OTHER PUBLICATIONS

The Japan Patent Office, Office Action, Japanese Patent Application No. 2023-181544, Nov. 28, 2024, eight pages.

(Continued)

*Primary Examiner* — Elmito Breval
(74) *Attorney, Agent, or Firm* — Fenwick & West LLP

(57) ABSTRACT

A transparent display apparatus, and a manufacturing method the same is disclosed. The transparent display apparatus comprises a substrate with a transparent area and a light emitting area. The light emitting area includes a first bank layer, a first light emitting cell contacting a first side of the first bank layer, and a second light emitting cell contacting a second side of the first bank layer, the transparent area includes a second bank layer, a first transparent cell contacting a first side of the second bank layer, and a second transparent cell contacting a second side of the second bank layer. The transparent display apparatus further comprises a third bank layer overlapping the boundary between the transparent area and the light emitting area, the first bank layer and the third bank layer have a regular tapered shape, and the second bank layer has an inverted tapered shape.

22 Claims, 20 Drawing Sheets

(56) References Cited

U.S. PATENT DOCUMENTS

| 2006/0152833 | A1 | 7/2006 | Halls et al. |
|---|---|---|---|
| 2011/0227875 | A1 | 9/2011 | Chung |
| 2012/0280894 | A1 | 11/2012 | Park |
| 2014/0183479 | A1 | 7/2014 | Park et al. |
| 2019/0058020 | A1 | 2/2019 | Tsai et al. |
| 2019/0305060 | A1 | 10/2019 | Hou |
| 2020/0227661 | A1 | 7/2020 | Nishikiori |
| 2021/0151712 | A1 | 5/2021 | Lee et al. |
| 2022/0181395 | A1 | 6/2022 | Youn et al. |
| 2022/0208865 | A1 | 6/2022 | Youn et al. |

FOREIGN PATENT DOCUMENTS

| JP | 2006-128241 | A | 5/2006 |
|---|---|---|---|
| JP | 2011-199247 | A | 10/2011 |
| JP | 2012-234798 | A | 11/2012 |
| JP | 2014-197623 | A | 10/2014 |
| JP | 2022-104551 | A | 7/2022 |
| KR | 10-2005-0085851 | A | 8/2005 |
| KR | 10-2014-0085979 | A | 7/2014 |
| KR | 10-2022-0081130 | A | 6/2022 |
| KR | 10-2022-0093874 | A | 7/2022 |
| TW | 201943068 | A | 11/2019 |

OTHER PUBLICATIONS

Taiwan Intellectual Property Office, Office Action, Taiwanese Patent Application No. 112139216, Jun. 24, 2024, 22 pages.

<u>B</u>

195a          195a

195c

195b

195b

TRANSPARENT DISPLAY APPARATUS AND MANUFACTURING METHOD OF THE SAME

CROSS-REFERENCE TO RELATED APPLICATION

This application claims the benefit of priority of the Republic of Korea Patent Application No. 10-2022-0189067 filed on Dec. 29, 2022, which is hereby incorporated by reference in its entirety.

BACKGROUND

Field of Technology

The present disclosure relates to a transparent display apparatus and a manufacturing method thereof.

Discussion of the Related Art

As the information society develops, the demand for a display apparatus for displaying an image is increasing in various forms. Accordingly, display apparatus such as liquid crystal display (LCD), organic light emitting display (OLED), micro light emitting diode display (micro LED display), and quantum dot display (QD) have been used in recent years.

The display apparatus is a display apparatus that outputs light using a light emitting device, and includes a display panel provided with light emitting devices.

Recently, research has been actively conducted on transparent display apparatus that not only display images to users but also transmit light so that objects or images located behind the display apparatus can be seen.

The transparent display apparatus includes a display area in which an image is displayed and a non-display area, and the display area may include a transparent area capable of transmitting external light and a light emitting area. The transparent display apparatus may have a high light transmittance rate in the display area through the transparent area.

However, the transparent display apparatus has a problem in that the light transmittance rate of the transparent area is reduced because organic substances constituting the light emitting device are unavoidably formed in the transparent area.

SUMMARY

The present disclosure has been made in view of the above problem and it is an object of the present disclosure to provide a transparent display apparatus capable of improving the light transmittance rate or aperture ratio of a transparent area by having an inverted tapered shape of a bank layer of the transparent area, and a manufacturing method thereof.

An object of the present disclosure is to provide a transparent display apparatus capable of improving the light transmittance rate or aperture ratio of the transparent area by forming a hydrophilic bank layer at the boundary between the transparent area and a light emitting area, and a manufacturing method thereof.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a transparent display apparatus comprising a substrate including a transparent area and a light emitting area and a manufacturing method thereof. The light emitting area includes a first bank layer, a first light emitting cell in contact with a first side of the first bank layer, and a second light emitting cell in contact with a second side of the first bank layer, the first light emitting cell and the second light emitting cell spaced apart from each other with the first bank layer interposed between the first light emitting cell and the second light emitting cell, the transparent area includes a second bank layer, a first transparent cell in contact with a first side of the second bank layer, and a second transparent cell in contact with a second side of the second bank layer, the first transparent cell and the second transparent cell are spaced apart from each other with the second bank layer interposed therebetween. The transparent display apparatus further comprises a third bank layer overlapping a boundary between the transparent area and the light emitting area, the first bank layer and the third bank layer have a tapered shape, and the second bank layer has an inverted tapered shape.

In one embodiment, a manufacturing method of a transparent display apparatus, the manufacturing method comprises: forming a thin film transistor on a substrate; forming a planarization layer on the thin film transistor; forming a first electrode on the planarization layer, the first electrode in a region overlapping a light emitting area of the transparent display apparatus; forming a bank layer on the planarization layer and the first electrode; forming an organic light emitting unit on the first electrode, the bank layer, and the planarization layer; adding a solvent to the organic light emitting unit disposed in a region overlapping a transparent area of the transparent display apparatus without adding the solvent to the organic light emitting unit in the region overlapping the light emitting area, and exposing the planarization layer in the region overlapping the transparent area through a vaporing process, and forming a second electrode on the organic light emitting unit in the light emitting area and the exposed planarization layer in the transparent area.

In one embodiment, a transparent display apparatus comprises: a substrate including a light emitting area and a transparent area, the transparent area more transparent than the light emitting area with respect to external light passing through the transparent area of the substrate and the external light passing through the light emitting area of the substrate; a transistor on the substrate; a planarization layer on the transistor, the planarization layer disposed in the transparent area and the light emitting area; a bank layer on the planarization layer at a boundary between the light emitting area and the transparent area; a first electrode in the light emitting area, the first electrode electrically connected to the transistor; a first organic light emitting unit on the first electrode in the light emitting area; a second organic light emitting unit in the transparent area, the second organic light emitting unit in contact with a portion of the bank layer in the transparent area and in contact with a first portion of the planarization layer in the transparent area; and a second electrode including a first portion of the second electrode that is on the first organic light emitting unit in the light emitting area and a second portion of the second electrode on the second organic light emitting unit in the transparent area and in contact with a second portion of the planarization layer in the transparent area.

In one embodiment, a transparent display apparatus comprises: a substrate including a transparent area and a light emitting area; a plurality of first bank layers that are spaced apart from each other in the light emitting area, the plurality of first bank layers having a first shape; a light emitting cell between the plurality of first bank layers in the light emitting area, the light emitting cell configured to emit light in the light emitting area; a plurality of second bank layers that are spaced apart from each other in the transparent area, the plurality of second bank layers having a second shape that is different from the first shape of the plurality of first bank layers; and a transparent cell between the plurality of second bank layers in the transparent area.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
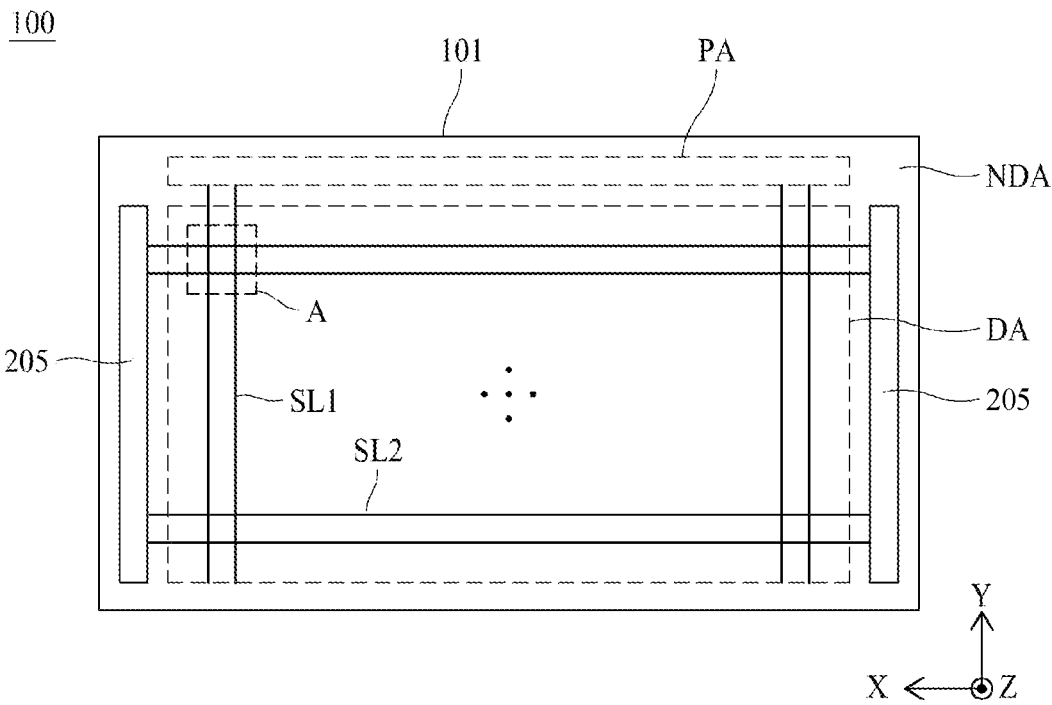
FIG. 1 is a diagram schematically illustrating a transparent display apparatus according to an embodiment of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of the claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have' and 'include' described in the present disclosure are used, another portion may be added unless 'only~' is used. The terms of a singular form may include plural forms unless referred to the contrary.

In construing an element, the element is construed as including an error band although there is no explicit description.

In describing a position relationship, for example, when the position relationship is described as 'upon~', 'above~', 'below~' and 'next to~', one or more portions may be disposed between two other portions unless 'just' or 'direct' is used.

Spatially relative terms such as "below", "beneath", "lower", "above", and "upper" may be used herein to easily describe a relationship of one element or elements to another element or elements as illustrated in the drawings. It will be understood that these terms are intended to encompass different orientations of a device in addition to the orientation depicted in the drawings. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after", "subsequent", "next", and "before", a case which is not continuous may be included, unless "just" or "direct" is used.

It will be understood that, although the terms "first", "second", etc. may be used herein to describe various elements, these elements should not be limited by these terms. These terms are only used to distinguish one element from another element. For example, a first element could be termed a second element, and similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in a co-dependent relationship.

In the addition of reference numerals to the components of each drawing describing embodiments of the present disclosure, the same components can have the same sign even if they are shown in different drawings.

In the embodiments of the present disclosure, a source electrode and a drain electrode are distinguished for convenience of description, and the source electrode and the drain electrode may be interchanged. The source electrode may be the drain electrode and vice versa. In addition, the source electrode of any one embodiment may be a drain electrode in another embodiment, and the drain electrode of any one embodiment may be a source electrode in another embodiment.

In some embodiments of the present disclosure, for convenience of description, a source area is distinguished from a source electrode, and a drain area is distinguished from a drain electrode, but embodiments of the present disclosure are not limited thereto. The source area may be the source electrode, and the drain area may be the drain electrode. In addition, the source area may be the drain electrode, and the drain area may be the source electrode.

FIG. 1 is a diagram schematically illustrating a transparent display apparatus 100 according to an embodiment of the present disclosure.

In the following, the X-axis represents a direction parallel to a scan line, the Y-axis represents a direction parallel to a data line, and the Z-axis represents a height direction of the transparent display apparatus.

The transparent display apparatus 100 according to an embodiment of this disclosure has been described as being implemented as an organic light emitting display, but may also be implemented as a liquid crystal display, a plasma display panel (PDP), a quantum dot light emitting display (QLED) or an electrophoresis display.

Referring to FIG. 1, a transparent display apparatus 100 according to an embodiment of this disclosure may include a transparent display panel 101 including a display area DA in which pixels are formed to display images and a non-display area NDA in which images are not displayed.

The display area DA of the transparent display panel 101 may include first signal lines SL1, second signal lines SL2, and pixels, and the non-display area NDA may include a pad area PA in which pads are disposed and at least one gate driver 205.

The first signal lines SL1 may extend in a first direction (or the Y-axis direction) and may intersect the second signal lines SL2 in the display area DA. The second signal lines SL2 may extend in a second direction (or the X-axis direction). The pixels are disposed in a region where the first signal line SL1 and the second signal line SL2 intersect, and may emit a certain amount of light to display an image.

The gate driver 205 may be connected to the scan line to supply a scan signal. The gate driver(s) 205 can be implemented in the non-display area NDA outside one or both sides of the display area DA of the transparent display panel 101 by a gate driver in panel (GIP) or tape automated bonding (TAB) method.

The pad area PA of the transparent display panel 101 may be electrically connected to a source drive integrated circuit, a circuit board, or a timing control device connected through a flexible circuit film.

Figure 2:
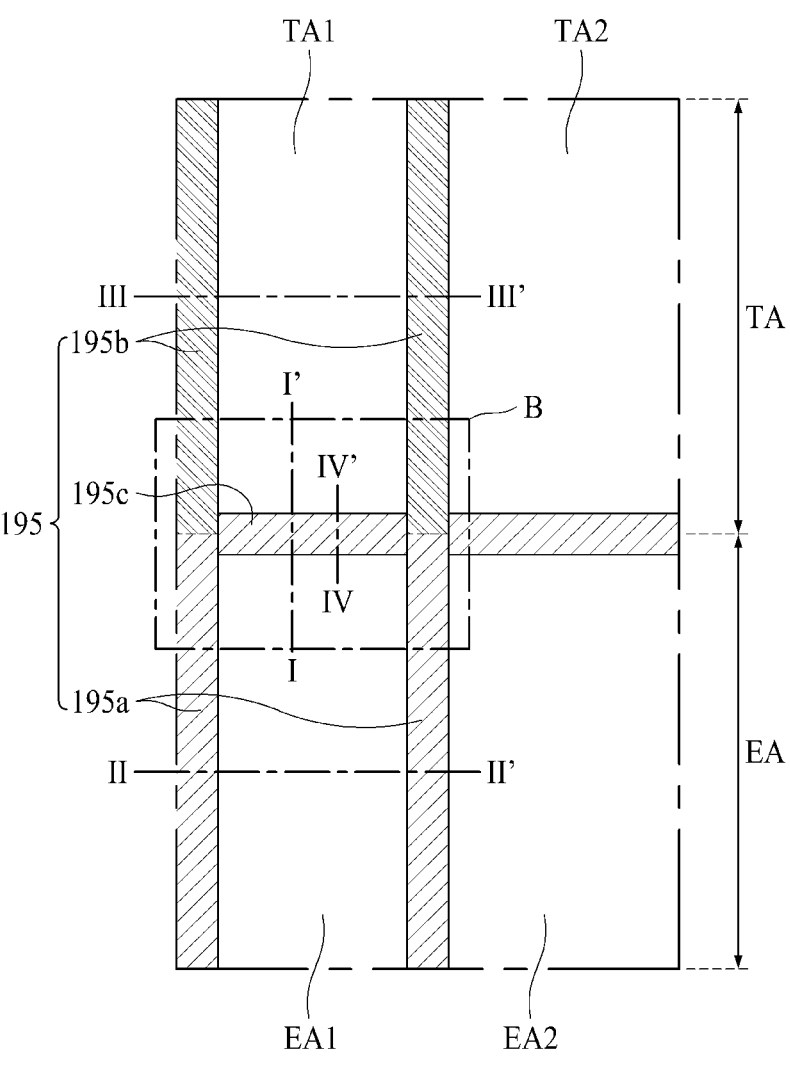
FIG. 2 is a diagram schematically illustrating a pixel provided in an area A of FIG. 1 according to an embodiment of the present disclosure.

FIG. 2 is a diagram schematically of a pixel provided in an area A of FIG. 1 according to an embodiment.

Referring to FIGS. 1 and 2, the display area DA may include a light emitting area EA and a transparent area TA.

The transparent area TA may be a region through which most of the external light incident from the outside passes through the transparent area TA. The light emitting area EA may be a region that does not transmit most of the external light incident from the outside. Thus, the transparent area TA is more transparent than the light emitting area EA with respect to external light passing through the transparent area TA of the substrate and the external light passing through the light emitting area EA of the substrate. In addition, the light emitting area EA may be a pixel area in which a plurality of light emitting cells EA1 and EA2 are disposed. Objects or backgrounds located on the rear of the transparent display panel 101 may be seen through the transparent display panel 101 due to the transparent area TA.

The light emitting area EA is disposed in a region adjacent to the transparent area TA. In addition, although not shown in the drawings, a plurality of signal lines may be disposed in the regions of the light emitting area EA and the transparent area TA. For example, the plurality of signal lines may include at least one of a pixel power line, a common power line, a data line, a reference line, and a scan line, but are not necessarily limited thereto.

Referring to FIG. 2, the light emitting area EA includes a first light emitting cell EA1, a second light emitting cell EA2, and a first bank layer 195a. Specifically, the light emitting area EA includes a first bank layer 195a, a first light emitting cell EA1 in contact with one side (e.g., a first side) of the first bank layer 195a, and a second light emitting cell EA2 in contact with the other side (e.g., a second side) of the first bank layer 195a. In this case, the light emitting cell means a region that emits colored light. However, an embodiment of the present disclosure is not limited thereto, and may further include a third light emitting cell and a fourth light emitting cell. Specifically, each of the first to fourth light emitting cells may be partitioned by the first bank layer 195a. For example, all of the first to fourth light emitting cells may emit light of different colors. For example, the first light emitting cell EA1 can emit green light, the second light emitting cell EA2 can emit red light, the third light emitting cell EA3 can emit blue light, and the fourth light emitting cell can emit white light, but they are not necessarily limited to thereto. In addition, the number of configurations, color type, arrangement type, and arrangement order of these light emitting cells can be configured in various forms depending on light emitting characteristics, device life, and device specifications.

Figure 3:
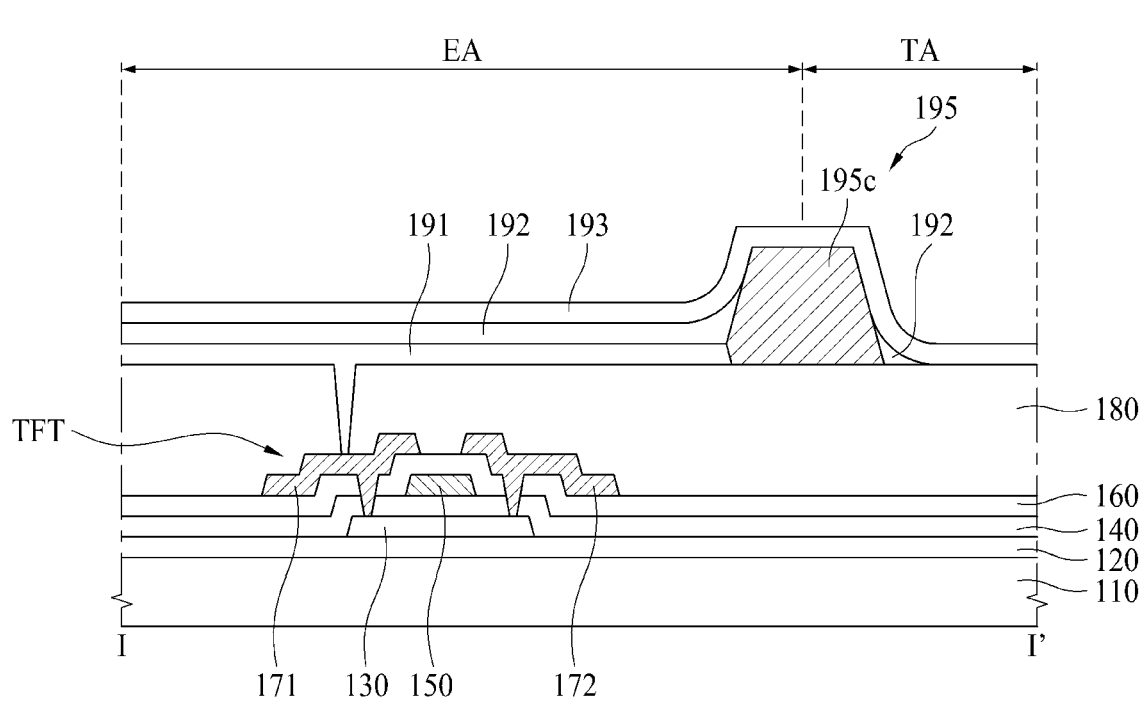
FIG. 3 is a cross-sectional view of I-I' of FIG. 2 according to an embodiment of the present disclosure.

Referring to FIG. 3, a substrate 110 of the transparent display panel 101 according to an embodiment of the present disclosure may include a transparent area TA and a light emitting area EA.

FIG. 3 is a cross-sectional view of I-I' of FIG. 2 according to one embodiment.

Referring to FIG. 3, the light emitting area EA may have a pixel circuit or multiple signal lines, the pixel circuit may include at least one thin film transistor TFT and a capacitor. For example, at least one thin film transistor TFT may include a switching thin film transistor, a sensing thin film transistor, a driving thin film transistor, and the like. The thin film transistor TFT may include an active layer 130, a gate electrode 150, a source electrode 171, and a drain electrode 172. In addition, the light emitting area EA may include a first electrode 191, an organic light emitting unit (or organic light emitting area) 192, and a second electrode 193 constituting the light emitting device. As shown in FIG. 3, a first portion of the second electrode 193 is on an organic light emitting unit 192 in the light emitting area EA. In one embodiment, a light emitting cell includes the first electrode 191, the organic light emitting unit (or organic light emitting area) 192, and the second electrode 193.

Specifically, the substrate 110 is a base substrate and may be a transparent glass substrate or a transparent plastic substrate. A buffer layer 120 may be disposed on the substrate 110.

The buffer layer 120 may be formed by stacking a single layer or a plurality of inorganic layers. For example, the buffer layer 120 can be formed as a single layer comprising of a silicon oxide (SiOx) layer, a silicon nitride (SiNx) layer, or a silicon oxynitride (SiOxNy) layer. Alternatively, the buffer layer 120 may consist of a multilayer in which at least two of the silicon oxide (SiOx) layer, the silicon nitride (SiNx) layer, and the silicon oxynitride (SiOxNy) layer are stacked. The buffer layer 120 may be formed on the entire upper surface of the substrate 110 to block ions or impurities diffused from the substrate 110 and to block moisture from penetrating the thin film transistor TFT or light emitting device through the substrate 110.

The active layer 130 may be disposed on the buffer layer 120. The active layer 130 may be formed of a silicon-based semiconductor material or an oxide-based semiconductor material. The active layer 130 may include a channel region overlapping the gate electrode 150 and a source/drain region connected to the source/drain electrodes 171 and 172.

A gate insulating layer 140 may be disposed on the active layer 130. The gate insulating layer 140 may perform a function of insulating the active layer 130 from the gate electrode 150. The gate insulating layer 140 may be made of an inorganic insulating material, for example, a silicon oxide (SiOx) layer, a silicon nitride (SiNx) layer, a silicon oxynitride (SiOxNy) layer, or a multilayer thereof. Alternatively, the gate insulating layer 140 may be disposed only at a portion that may cover the active layer 130. In addition, the gate insulating layer 140 may be disposed in the light emitting area EA, and may not be disposed in at least a part of the transparent area TA to improve the light transmittance rate of the transparent area TA.

The gate electrode 150 may be disposed on the gate insulating layer 140. The gate electrode 150 may be disposed to overlap the active layer 130 with the gate insulating layer 140 interposed therebetween. The gate electrode 150 may be formed of a single layer or a multilayer made of any one of molybdenum (Mo), aluminum (Al), chromium (Cr), gold (Au), titanium (Ti), nickel (Ni), neodymium (Nd), and copper (Cu), or an alloy thereof.

An interlayer insulating layer 160 may be disposed on the gate insulating layer 140 and the gate electrode 150. The interlayer insulating layer 160 may be formed to cover the gate electrode 150. The interlayer insulating layer 160 may perform a function of protecting the thin film transistor TFT. The interlayer insulating layer 160 may be composed of a silicon oxide (SiOx) layer, a silicon nitride (SiNx) layer, a silicon oxynitride (SiOxNy) layer, or a multilayer thereof. Alternatively, the interlayer insulating layer 160 may be disposed in the light emitting area EA, and may not be disposed in at least a part of the transparent area TA to improve the light transmittance rate of the transparent area TA.

Source/drain electrodes 171 and 172 may be disposed on the interlayer insulating layer 160. A corresponding region of the interlayer insulating layer 160 may be removed to contact the active layer 130 with the source/drain electrodes 171 and 172. For example, the source/drain electrodes 171, 172 can be electrically connected by contacting the active layer 130 through a contact hole that penetrates the interlayer insulating layer 160 and the gate insulating layer 140.

The source/drain electrodes 171, 172 may be formed of a single layer or multiple layers made of any one of molybdenum (Mo), aluminum (Al), chromium (Cr), gold (Au), titanium (Ti), nickel (Ni), neodymium (Nd), and copper (Cu).

A planarization layer 180 may be disposed on the interlayer insulating layer 160 and the thin film transistor TFT. The planarization layer 180 may be formed to cover the thin film transistor TFT. The planarization layer 180 protects the thin film transistor TFT and may be formed of an inorganic insulating material. For example, the planarization layer 180 may comprise of a silicon oxide (SiOx) layer, a silicon nitride (SiNx) layer, a silicon oxynitride (SiOxNy) layer, or a multilayer thereof.

A first electrode 191 (or an anode electrode) constituting a light emitting device may be disposed on the planarization layer 180. The first electrode 191 may be disposed in the light emitting area EA. The first electrode 191 may be connected to the source/drain electrodes 171 and 172 of the thin film transistor TFT through a contact hole penetrating the planarization layer 180. FIG. 3 shows a configuration in which the first electrode 191 is connected to the source electrode 171 of the thin film transistor TFT through a contact hole.

The first electrode 191 may be formed of a metal, a metal alloy, or a combination of a metal and an oxide. For example, the first electrode 191 may be formed in a multi-layer structure including a transparent electrode layer made of a transparent conductive material and a reflective electrode layer made of an opaque conductive material with high reflection efficiency. The transparent electrode layer of the first electrode 191 is made of a material with a relatively large work function value such as indium tin oxide (ITO) or indium zinc oxide (IZO), and the reflective electrode layer may be made of any one of silver (Ag), aluminum (Al), copper (Cu), molydenum (Mo), titanium (T), nickel (Ni), chromium (Cr), or tungsten (W), or a single layer or multilayer of an alloy thereof. For example, the first electrode 191 may be formed in a structure in which a transparent electrode layer, a reflective electrode layer, and a transparent electrode layer are sequentially stacked, or a transparent electrode layer and a reflective electrode layer are sequentially stacked. However, the present disclosure is not limited thereto.

A bank layer 195 may be disposed on the first electrode 191 and the planarization layer 180. The bank layer 195 includes a first bank layer 195a, a second bank layer 195b, and a third bank layer 195c described below. FIG. 3 illustrates a configuration in which a third bank layer 195c is disposed on the first electrode 191 and the planarization layer 180. Although not illustrated in the drawings, the first bank layer 195a and the second bank layer 195b may be disposed on the first electrode 191 and the planarization layer 180. The bank layer 195 may be disposed on the light emitting area EA and the transparent area TA. Specifically, FIG. 3 shows a configuration in which the third bank layer 195c overlaps the boundary between the light emitting area EA and the transparent area TA.

According to an embodiment of the present disclosure, the bank layer 195 may be made of an inorganic material such as a silicon oxide (SiOx), a silicon nitride (SiNx), a silicon oxynitride (SiOxNy), and the like. Alternatively, the bank layer 195 may comprise of organic materials such as polyimide, acrylate, and benzocyclobutene series resin. The bank layer 195 will be described in detail below.

An organic light emitting unit 192 (e.g., a layer) constituting a light emitting device and a second electrode 193 may be disposed on the first electrode 191 and the bank layer 195. FIG. 3 shows the configuration in which the organic light emitting unit 192 is placed on the first electrode 191, the third bank layer 195*c*, and the planarization layer 180. In addition, FIG. 3 shows the configuration of a second portion of the second electrode 193 disposed on the organic light emitting unit 192 and the planarization layer 180 in the transparent area TA where the second portion of the second electrode 193 is electrically connected to the first portion of the second electrode 193 in the light emitting area EA. Furthermore, the second electrode 193 overlaps an upper end (e.g., an upper surface) of the third bank layer 195*c* as shown in FIG. 3.

The organic light emitting unit 192 includes an R-organic light emitting layer that emits red light, a G-organic light emitting layer that emits green light, and a B-organic light emitting layer that emits blue light, respectively. Although not shown in the drawing, the organic light emitting unit 192 may have an electron injection layer and a hole injection layer that inject electrons and holes into the organic light emitting layer, and an electron transport layer and a hole transport layer that transport injected electrons and holes to the organic light emitting layer. In addition, the organic emitting layer may be formed as a white organic emission layer that emits white light.

Referring to FIG. 3, the first electrode 191 is the anode of the organic light emitting unit 192, and the second electrode 193 is the cathode of the organic light emitting unit 192, and when a voltage is applied to the first electrode 191 and the second electrode 193, electrons are injected into the organic light emitting unit 192 from the first electrode 191 and holes are injected into the organic light emitting unit 192 from the second electrode 193 to generate light.

Referring to FIG. 3, the light emitting area EA includes a first electrode 191, an organic light emitting unit 192, and a first portion of a second electrode 193. FIG. 3 shows a configuration in which the first electrode 191, the organic light emitting unit 192 on the first electrode 191, and the first portion of the second electrode 193 on the organic light emitting unit 192 are disposed in the light emitting area EA.

Furthermore, referring to FIG. 3, the transparent area TA includes an organic light emitting unit 192 and a second portion of the second electrode 193 but lacks the first electrode 191. In one embodiment, the organic light emitting unit 192 and the second portion of the second electrode 193 in the transparent area TA collectively form a transparent unit in the transparent area TA. FIG. 3 shows a configuration in which the organic light emitting unit 192 on the planarization layer 180 and the second electrode 193 on the organic light emitting unit 192 are disposed in the transparent area TA. Specifically, the organic light emitting unit 192 in the transparent area TA is in contact with a first portion of the planarization layer 180 and at least a part of the second portion of the second electrode 193 may be in contact with a second portion of the planarization layer 180 in the transparent area as shown in FIG. 3.

More specifically, a part of the organic light emitting unit 192 may remain on the side surface of the bank layer 195 in the transparent area TA and may contact at least a part of the planarization layer 180. For example, in FIG. 3, the organic light emitting unit 192 may remain partially on the side surface of the third bank layer 195*c* and may contact a part of the planarization layer 180.

According to an embodiment of the present disclosure, the light emitting area EA includes a first bank layer 195*a*, a first light emitting cell EA1, and a second light emitting cell EA2.

Specifically, the light emitting area EA includes a first bank layer 195*a*, a first light emitting cell EA1 in contact with a first side of the first bank layer 195*a*, and a second light emitting cell EA2 in contact with a second side of the first bank layer 195*a*. The first light emitting cell EA1 and the second light emitting cell EA2 are spaced apart from each other with the first bank layer 195*a* interposed therebetween. FIG. 2 shows a configuration in which the first light emitting cell EA1 and the second light emitting cell EA2 are spaced apart from each other with the first bank layer 195*a* interposed therebetween. Although not shown in the drawings, in addition to the first light emitting cell EA1 and the second light emitting cell EA2, a third light emitting cell and a fourth light emitting cell may be included, and the light emitting area EA may include five or more light emitting cells. In this case, the first bank layer 195*a* may be included between the light emitting cells.

According to an embodiment of the present disclosure, the transparent area TA includes a second bank layer 195*b*, a first transparent cell TA1, and a second transparent cell TA2.

Specifically, the transparent area TA includes a second bank layer 195*b*, a first transparent cell TA1 in contact with one side (e.g., a first side) of the second bank layer 195*b*, and a second transparent cell TA2 in contact with the other side (e.g., a second side) of the second bank layer 195*b*. The first transparent cell TA1 and the second transparent cell TA2 are spaced apart from each other with the second bank layer 195*b* interposed therebetween. FIG. 2 shows a configuration in which the first transparent cell TA1 and the second transparent cell TA2 are spaced apart from each other with the second bank layer 195*b* interposed therebetween. Although not shown in the drawings, in addition to the first transparent cell TA1 and the second transparent cell TA2, a third transparent cell and a fourth transparent cell may be included, and the transparent area TA may include five or more transparent cells. In this case, the second bank layer 195*b* may be included between the transparent cells.

The transparent display apparatus 100 according to an embodiment of the present disclosure includes a third bank layer 195*c* overlapping the boundary between the transparent area TA and the light emitting area EA.

FIG. 2 shows a configuration in which the third bank layer 195*c* overlaps at least a part of the transparent area TA and at least a part of the light emitting area EA. In addition, the third bank layer 195*c* is divided into several parts with the first bank layer 195*a* and the second bank layer 195*b* interposed therebetween. That is, the third bank layer 195*c* includes a plurality of third bank layer portions that collectively form the third bank layer 195C. FIG. 2 illustrates a first third bank portion (e.g., left portion) and a second third bank portion (e.g., a right portion) with the second bank layer 195*b* and the first bank layer 195*a* between the first third bank portion and the second third bank portion. Although not illustrated in the drawings, the third and fourth transparent cells and the third and fourth light emitting cells may include a third bank layer 195*c* overlapping the boundary between the third and fourth transparent cells and the third and fourth light emitting cells.

That is, the bank layer 195 may include all of the first bank layer 195*a*, the second bank layer 195*b*, and the third bank layer 195*c* described above.

According to an embodiment of the present disclosure, the first bank layer 195*a* and the second bank layer 195*b* may be disposed in a straight line with each other (See FIG. 2) in a plan view of the transparent display apparatus 100. That is, the first bank layer 195*a* and the second bank layer 195b extend in the first direction (Y-axis direction) such that a substantially straight line is formed by the first bank layer 195a and the second bank layer 195b in the plan view.

Figure 4:
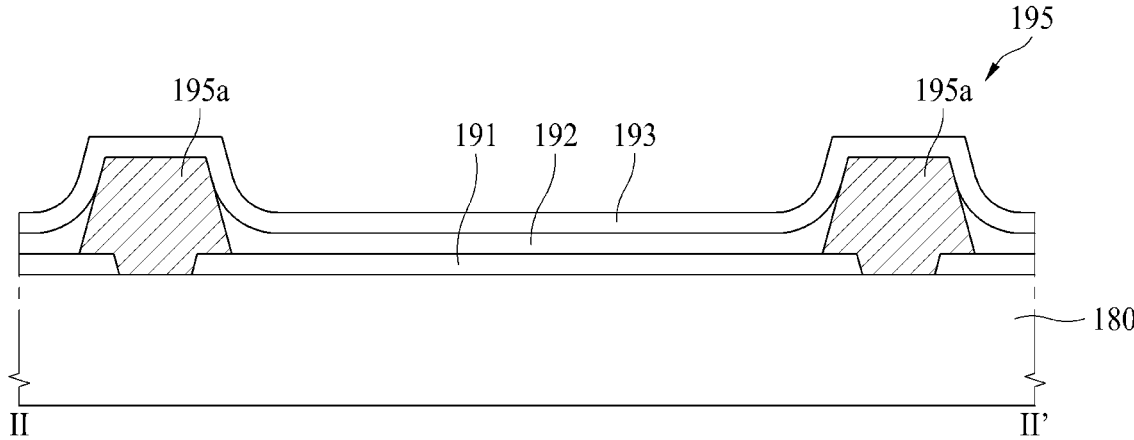
FIG. 4 is a cross-sectional view of II-II' of FIG. 2 to show a schematic shape of the first bank layer according to an embodiment of the present disclosure.

FIG. 4 is a cross-sectional view of II-II' of FIG. 2 to show a schematic shape of the first bank layer 195a according to one embodiment.

Figure 5:
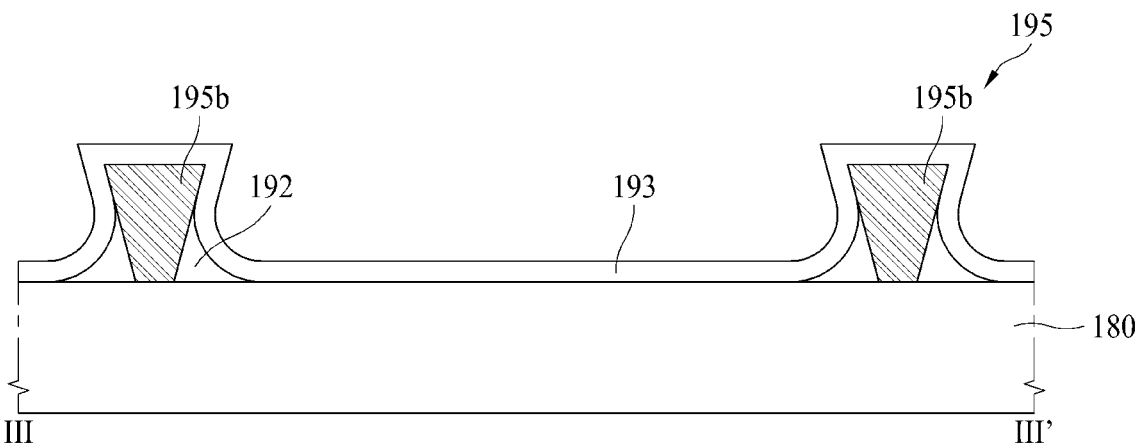
FIG. 5 is a cross-sectional view of III-III' of FIG. 2 to show a schematic shape of the second bank layer according to an embodiment of the present disclosure.

FIG. 5 is a cross-sectional view of III-III' of FIG. 2 to show a schematic shape of the second bank layer according to one embodiment.

Figure 6:
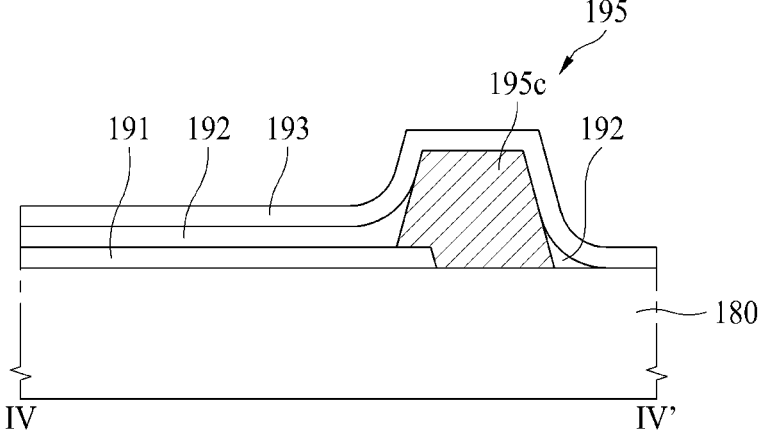
FIG. 6 is a cross-sectional view of IV-IV' of FIG. 2 to show a schematic shape of the third bank layer according to an embodiment of the present disclosure.

FIG. 6 is a cross-sectional view of IV-IV' of FIG. 2 to show a schematic shape of the third bank layer according to one embodiment. Each configuration of the thin film transistor TFT is omitted because it has been described in the previous drawing, and the first bank layer 195a, the second bank layer 195b, and the third bank layer 195c disposed on the planarization layer 180 are described in detail.

According to an embodiment of the present disclosure, the first bank layer 195a may have a regular tapered shape. Specifically, FIG. 4 illustrates a configuration in which the first bank layer 195a has a regular tapered shape. The first bank layer 195a with a regular tapered shape has a shape that the width gradually widens toward the end, and the lower side of the end protrudes more than the upper side thereof. That is, the first bank layer 195a includes a lower end and an upper end and the first bank layer 195a tapers from the lower end to the upper end. Thus, a width of the lower end of the first bank layer 195a is wider than a width of the upper end of the first bank layer 195a.

According to another embodiment of the present disclosure, the second bank layer 195b may have an inverted tapered shape. Specifically, FIG. 5 illustrates a configuration in which the second bank layer 195b has an inverted tapered shape. More specifically, the second bank layer 195b with an inverted tapered shape has a shape in which the width gradually decreases toward the end, and the upper side of the end protrudes more than the lower side thereof. That is, the second bank layer 195b includes a lower end and an upper end and the second bank layer 195a widens from the lower end to the upper end. Thus, a width of the lower end of the second bank layer 195b is narrower than a width of the upper end of the second bank layer 195b.

According to another embodiment of the present disclosure, the third bank layer 195c may have a regular tapered shape. Specifically, FIG. 6 illustrates a configuration in which the third bank layer 195c has a regular tapered shape. More specifically, the third bank layer 195c with a regular tapered shape has a shape that the width gradually widens toward the end, and the lower side of the end protrudes more than the upper side thereof. That is, the third bank layer 195c includes a lower end and an upper end and the third bank layer 195c tapers from the lower end to the upper end. Thus, a width of the lower end of the third bank layer 195c is wider than a width of the upper end of the first bank layer 195a.

According to an embodiment of the present disclosure, the third bank layer 195c overlaps the boundary between the transparent area TA and the light emitting area EA, and divides the transparent area TA and the light emitting area EA. In addition, the third bank layer 195c is disposed at the boundary between the transparent area TA and the light emitting area EA, and when the organic light emitting material is ink-jetted on the light emission area EA and the transparent area TA, overflow of the organic light emitting material can be blocked or prevented, and when a solvent is added to the organic light emitting unit 192 of the transparent area TA, the overflow of the solvent of the transparent area TA to the light emitting area EA is blocked or prevented, thereby the stability of the device is secured.

According to an embodiment of this disclosure, when the first bank layer 195a has a regular taper shape and the second bank layer 195b has an inverted taper shape, the taper directions of the first bank layer 195a and the second bank layer 195b may be reversed. Therefore, in addition to the third bank layer 195c, when the organic light emitting material is ink-jetted on the light emission part EA and the transparent area TA, overflow of the organic light emitting material can be blocked or prevented, and when a solvent is added to the organic light emitting unit 192 of the transparent area TA, the overflow of the solvent of the transparent area TA to the light emitting area EA is blocked or prevented, thereby the stability of the device is secured.

According to an embodiment of the present disclosure, the first bank layer 195a may have hydrophobicity. Specifically, the first bank layer 195a may be formed of an organic insulating material or an inorganic insulating material, and a surface thereof may be hydrophobically surface-treated. For example, after plasmaizing a mixture of fluoride gas such as $CF_4$ or $C_2F_6$ and Ar gas, the surface of the first bank layer 195a may be plasma-treated by the plasma to increase the contact angle of the first bank layer 195a so that the surface of the first bank layer 195a may be hydrophobic.

In addition, additives such as hydrophobic polymers may be added to the organic insulating material for forming the first bank layer 195a to make the surface of the first bank layer 195a hydrophobic. In this case, an embodiment in which the first bank layer 195a has hydrophobicity is not limited thereto, and may include other methods.

According to an embodiment of the present disclosure, the second bank layer 195b may have hydrophobicity. The second bank layer 195b may have hydrophobicity in the same manner as the first bank layer 195a. However, an embodiment of the present disclosure is not limited thereto, and may have hydrophobicity different from that of the first bank layer 195a.

According to an embodiment of this disclosure, since the first bank layer 195a and the second bank layer 195b are hydrophobic, the organic light-emitting material is not present on the upper surface or inclined side of the first bank layer 195a and the second bank layer 195b, but is formed only on the etched area, that is, the first electrode 191 or the planarization layer 180.

According to an embodiment of the present disclosure, the third bank layer 195c may have hydrophilicity. Specifically, the surface of the third bank layer 195c can be hydrophilic by coating the third bank layer 195c with a hydrophilic photosensitive material, for example, polyimide or acrylic, using a coating device (not shown).

According to an embodiment of the present disclosure, since the third bank layer 195c has hydrophilicity, the spread of the organic light emitting material may not be prevented. Specifically, due to the hydrophilicity of the third bank layer 195c, the organic light emitting material may be uniformly spread up and down.

Figure 7:
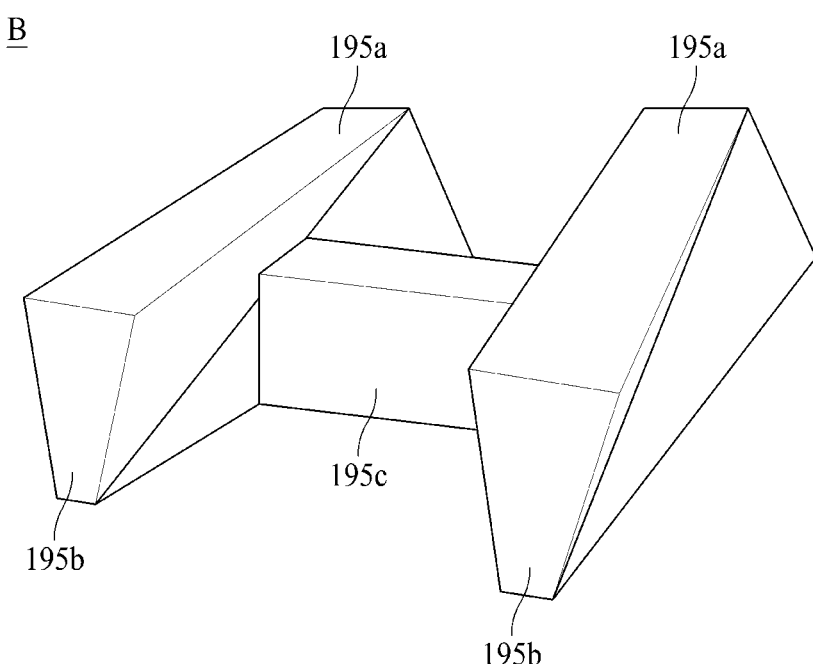
FIG. 7 is a perspective view schematically illustrating an area B of FIG. 2 according to an embodiment of the present disclosure.

FIG. 7 is a perspective view schematically illustrating an area B of FIG. 2 according to one embodiment.

In FIG. 7, a first bank layer 195a, a second bank layer 195b, and a third bank layer 195c are illustrated. Specifically, a first bank layer 195a in the shape of a regular tapered, a second bank layer 195b in the shape of an inverted tapered, and a third bank layer 195c in the shape of a regular tapered are illustrated.

More specifically, referring to FIG. 7, the first bank layer 195a has a shape in which the width of the lower surface of the first bank layer 195a narrows toward the third bank layer 195c, and the width of the upper surface of the first bank layer 195*a* widens toward the third bank layer 195*c*. In addition, the second bank layer 195*b* has a shape in which the width of the lower surface of the second bank layer 195*b* widens as it approaches the third bank layer 195*c*, and the upper surface of the second bank layer 195*b* narrows as it approaches the third bank layer 195*c*.

Figure 8A:
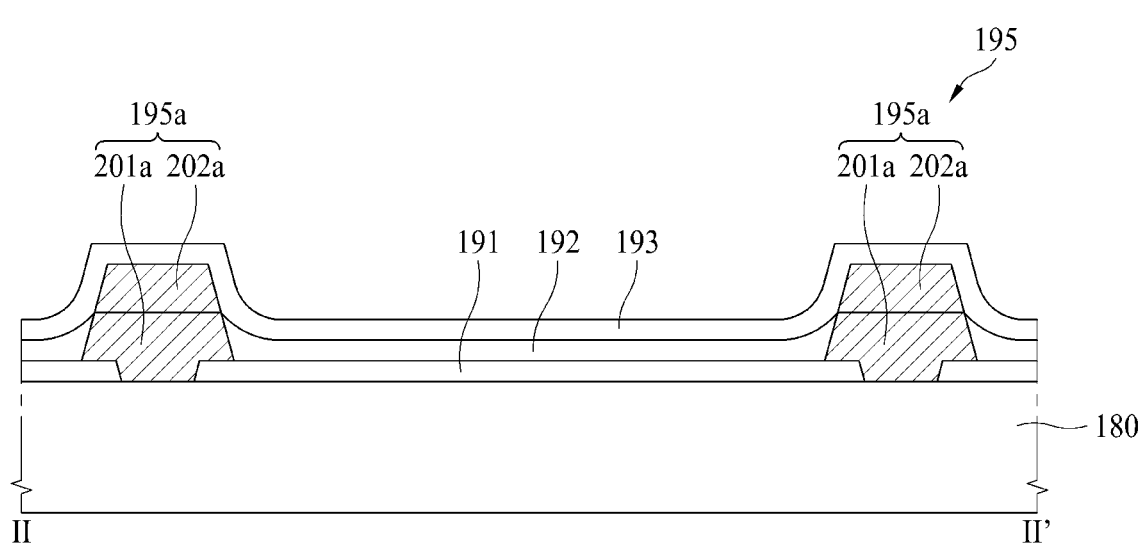
FIG. 8A is a cross-sectional view of I-II' of FIG. 2 for illustrating another embodiment of the first bank layer according to an embodiment of the present disclosure.

FIG. 8A is a cross-sectional view of II-II′ of FIG. 2 illustrating another embodiment of the first bank layer.

Figure 8B:
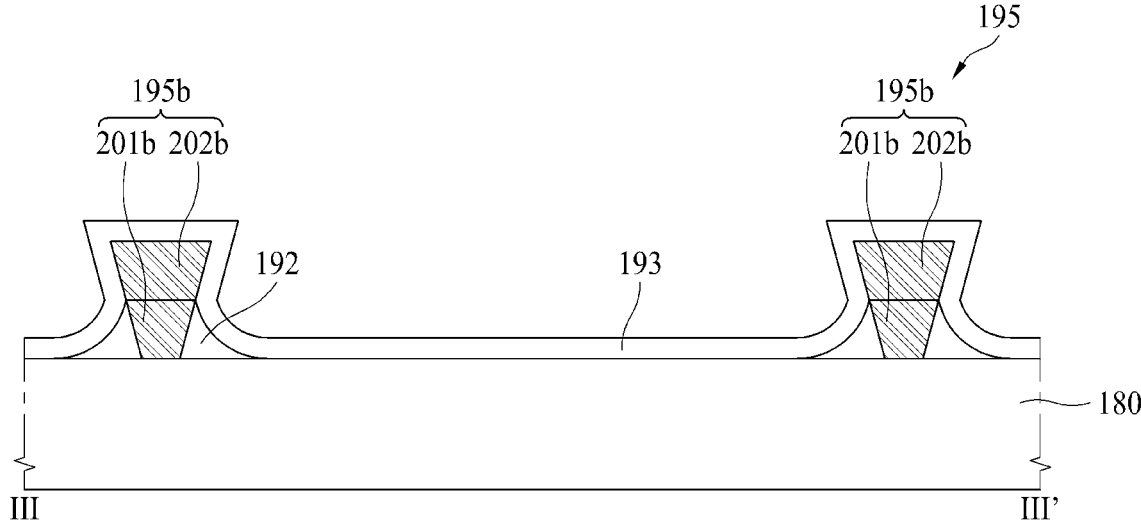
FIG. 8B is a cross-sectional view of III-III' of FIG. 2 for illustrating another embodiment of the second bank layer according to an embodiment of the present disclosure.

FIG. 8B is a cross-sectional view of III-III′ of FIG. 2 illustrating another embodiment of the second bank layer.

The bank layer 195 may have a double layer structure. According to an embodiment of the present disclosure, the first bank layer 195*a* includes a first layer 201*a* and a second layer 202*a*. Specifically, FIG. 8A illustrates a configuration in which a first layer 201*a* and a second layer 202*a* on the first layer 201*a* are disposed in the first bank layer 195*a*. As shown in FIG. 8A, an end of an inclined side surface of the first layer 201*a* is aligned with an end of an inclined side surface of the second layer 202*a* such that the slopes of the inclined side surfaces of the first layer 201*a* and the second layer 202*a* are the same. The first layer 201*a* may include a hydrophilic material, and the second layer 202*a* may include a hydrophobic material.

Since the first layer 201*a* of the first bank layer 195*a* is hydrophilic, a force that attracts organic light-emitting materials acts on the side of the first layer 201*a* of the first bank layer 195*a* so that the organic light-emitting material spreads well on the surface of the first electrode 191 and further brought into contact with the side surface of the first layer 201*a* of the first bank layer 195*a*.

In addition, since the second layer 202*a* of the first bank layer 195*a* has hydrophobicity, overflow can be blocked or prevented by pushing organic light-emitting materials from the side of the second layer 202*a* of the first bank layer 195*a*. Therefore, as the first bank layer 195*a* of the light emitting area EA has a double layer structure with hydrophobicity and hydrophilicity, the aperture rate or light transmittance rate of the light emitting area EA can be improved while preventing or suppressing overflow of organic light emitting materials.

According to an embodiment of the present disclosure, the second bank layer 195*b* includes a first layer 201*b* and a second layer 202*b*. Specifically, FIG. 8B illustrates a configuration in which a first layer 201*b* and a second layer 202*b* on the first layer 201*b* are disposed in the second bank layer 195*b*. The first layer 201*b* may include a hydrophilic material, and the second layer 202*b* may include a hydrophobic material. Contents overlapping the first bank layer 195*a* are omitted. As shown in FIG. 8B, an end of an inclined side surface of the first layer 201*b* is aligned with an end of an inclined side surface of the second layer 202*b* such that the slopes of the inclined side surfaces of the first layer 201 and the second layer 202*b* are the same.

Since the second bank layer 195*b* has a double layer structure with hydrophobicity and hydrophilicity, it is possible to improve the aperture rate or light transmittance rate of the transparent area TA while preventing or suppressing overflow of organic light-emitting materials.

Figure 9:
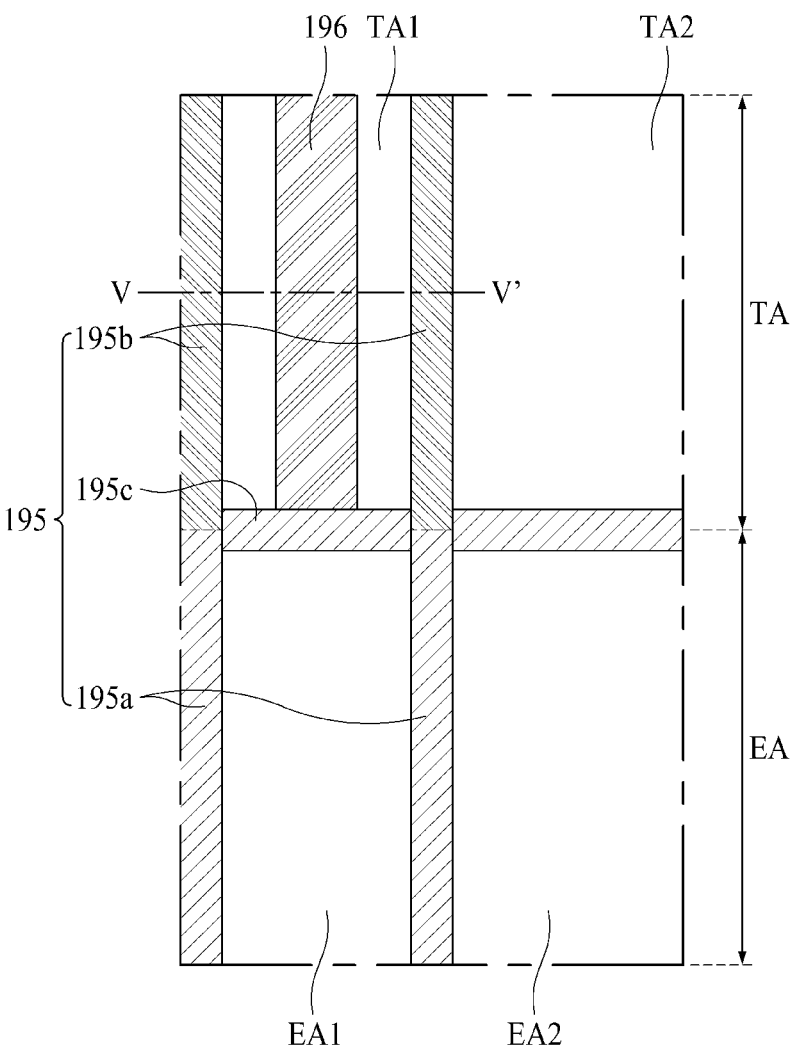
FIG. 9 is a plan view illustrating another embodiment of a pixel disposed in FIG. 1 according to an embodiment of the present disclosure.
Figure 10:
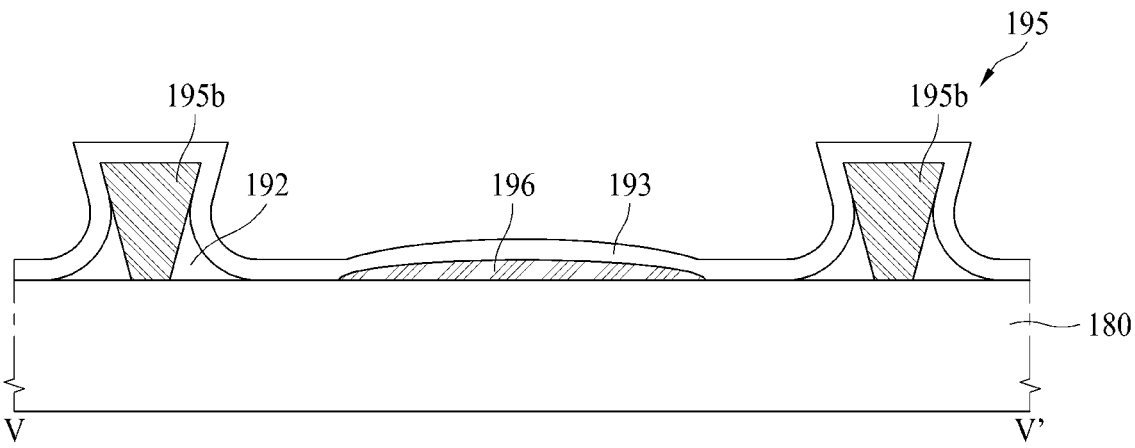
FIG. 10 is a cross-sectional view of V-V' of FIG. 9 according to an embodiment of the present disclosure.

FIG. 9 is a plan view illustrating a pixel arranged in FIG. 1 according to another embodiment, and FIG. 10 is a cross-sectional view taken along line V-V′ of FIG. 9 according to one embodiment. Hereinafter, duplicate contents are omitted.

According to another embodiment of the present disclosure, the transparent area TA may include a transparent layer 196. FIG. 9 illustrates a configuration in which a transparent layer 196 is further included in the transparent area TA.

Specifically, the transparent layer 196 is disposed on the first transparent cell TA1 of the transparent area TA. However, one embodiment of this disclosure is not limited to this, and the transparent layer 196 may be disposed on the second transparent cell TA2 of the transparent area TA, or may be disposed on the first transparent cell TA1 and the second transparent cell TA2 at the same time.

In addition, referring to FIGS. 9 and 10, the transparent layer 196 is disposed to be spaced apart from the second bank layer 195*b*. However, the arrangement and structure of the transparent layer 196 according to another embodiment of the present disclosure is not limited thereto.

According to another embodiment of the present disclosure, the transparent layer 196 may be hydrophilic or hydrophobic. In addition, the transparent layer 196 is a configuration disposed on the transparent area TA, and may include a material having high light transmittance rate.

According to another embodiment of the present disclosure, the organic light emitting unit 192 needs to remain on the side of the second bank layer 195*b* to increase the light transmittance rate of the transparent area TA. Specifically, it is necessary to have the organic light emitting unit 192 pushed out to the side surface of the second bank layer 195*b*. At this time, the process of removing the organic light emitting unit 192 and remaining the same on the side surface of the second bank layer 195*b* is illustrated in the right drawing of FIGS. 11J to 11L.

Referring to FIG. 10, a second electrode 193 may be disposed on the second bank layer 195*b* and the transparent layer 196. Specifically, the second electrode 193 is disposed on the second bank layer 195*b*, the organic light emitting unit 192, the planarization layer 180, and the transparent layer 196.

According to another embodiment of the present disclosure, when the transparent layer 196 has hydrophilic properties, a hydrophilic material may be included. For example, the hydrophilic material may be Poly(3,4-ethylenedioxythiophene): poly(styrenesulfonate) or transparent conductive oxide, which may include any one of IGZO (InGaZnO)-based material, ITO (InSnO)-based material, FTO (FSnO)-based material, and ZO(ZnO)-based material. However, an embodiment of the present disclosure is not limited thereto. When the transparent layer 196 is hydrophilic, the organic light emitting unit 192 may remain only on the side surface of the second bank layer 195*b* through the bending of each layer stacked under the transparent layer 196. In one embodiment, the transparent layer 196 has a curved upper surface.

According to another embodiment of the present disclosure, when the transparent layer 196 has hydrophobicity, it may include a hydrophobic material. For example, hydrophobic materials may contain any one of poly-thiophene, polyaniline, and carbon nanotubes. When the transparent layer 196 is hydrophobic, the organic light emitting unit 192 is gathered toward the second bank layer 195*b*, and the transmittance or aperture ratio of the transparent area TA may be improved.

Hereinafter, a method of manufacturing the transparent display apparatus 100 according to an embodiment of the present disclosure will be described.

According to an embodiment of this disclosure, the manufacturing method of a transparent display apparatus 100 includes forming a thin film transistor TFT on a substrate 110, forming a planarization layer 180 on a thin film transistor TFT, forming a first electrode 191 on a planarization layer 180 in the region overlapping the light emitting area EA, forming the bank layer 195 on the planarization layer 180 and the first electrode 191, forming the organic light emitting unit 192 on the first electrode 191, the bank layer 195 and the planarization layer 180, adding a solvent to the organic light emitting unit 192 disposed in the region overlapping the transparent area TA, and exposing the planarization layer 180 through a vaporing process, and forming the second electrode 193 on the organic light emitting unit 192 and the exposed planarization layer 180. A description of each configuration is omitted because it is redundant.

FIGS. 11A to 11M are process diagrams illustrating a method of manufacturing a transparent display apparatus 100 according to an embodiment of FIG. 2 of the present disclosure. Specifically, the left drawing of FIGS. 11A to 11M is a process diagram for explaining a manufacturing method in an area overlapping the first bank layer 195*a*, which corresponds to a cross-sectional view cut along II-II' of FIG. 2. In addition, the right drawing of FIGS. 11A to 11M is a process diagram for explaining the manufacturing method in an area overlapping the second bank layer 195*b*, which corresponds to the cross-sectional view cut along III-III' of FIG. 2. In FIGS. 11A to 11I, each manufacturing stage on the left and right sides is carried out simultaneously. In this case, in FIGS. 11A to 11M, a step of forming the thin film transistor TFT is omitted.

Figure 11A:
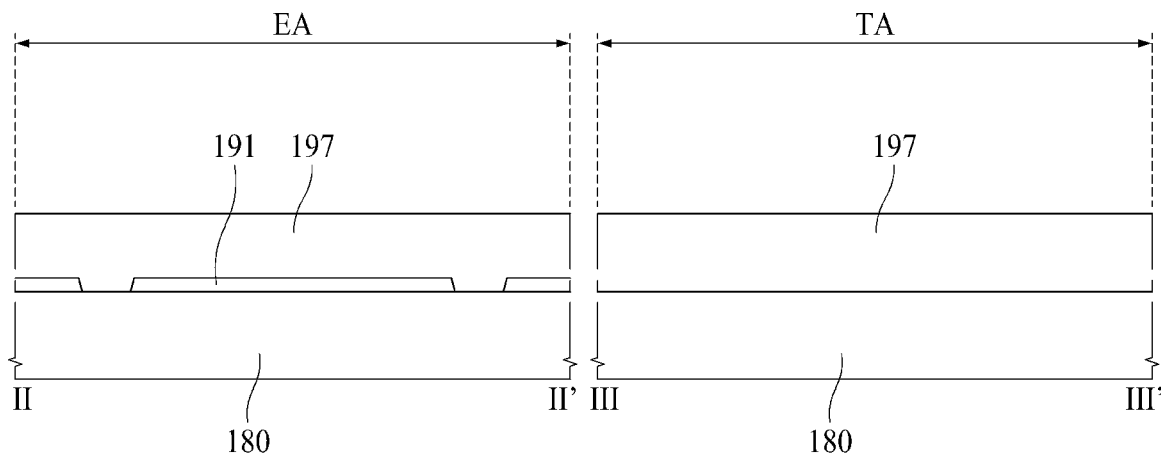
FIGS. 11A to 11M are process diagrams illustrating a method of manufacturing a transparent display apparatus of FIG. 2 according to an embodiment of the present disclosure.

Referring to the left drawing of FIG. 11A, a bank material 197 is deposited on the first electrode 191 of the light emitting area EA. Referring to the right drawing of FIG. 11A, a bank material 197 is deposited on the planarization layer 180 of the transparent area TA.

Figure 11B:
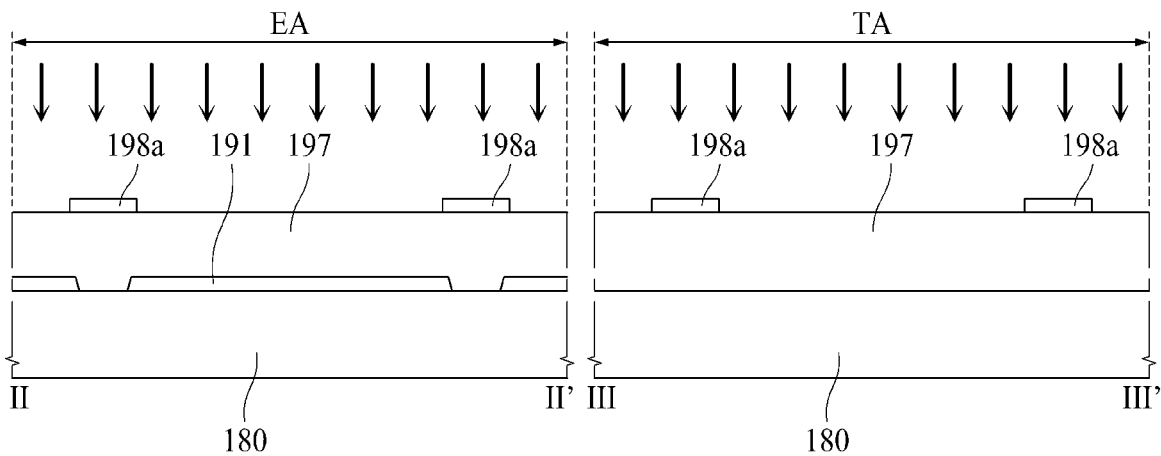

Referring to the left drawing of FIG. 11B, the first photoresist material 198*a* is patterned on the bank material 197 of the light emitting area EA. Referring to the right drawing of FIG. 11B, the first photoresist material 198*a* is patterned on the bank material 197 of the transparent area TA.

Figure 11C:
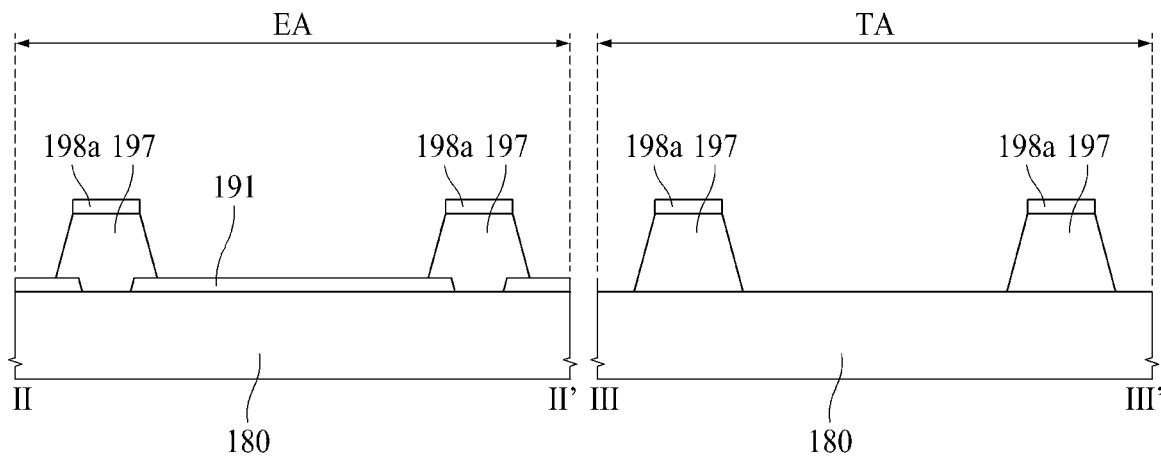

Referring to the left drawing of FIG. 11C, the bank material 197 of the light emitting area EA is etched, and the first electrode 191 of the light emitting area EA is exposed. Referring to the right drawing of FIG. 11C, the bank material 197 of the transparent area TA is etched, and the planarization layer 180 of the transparent area TA is exposed.

Figure 11D:
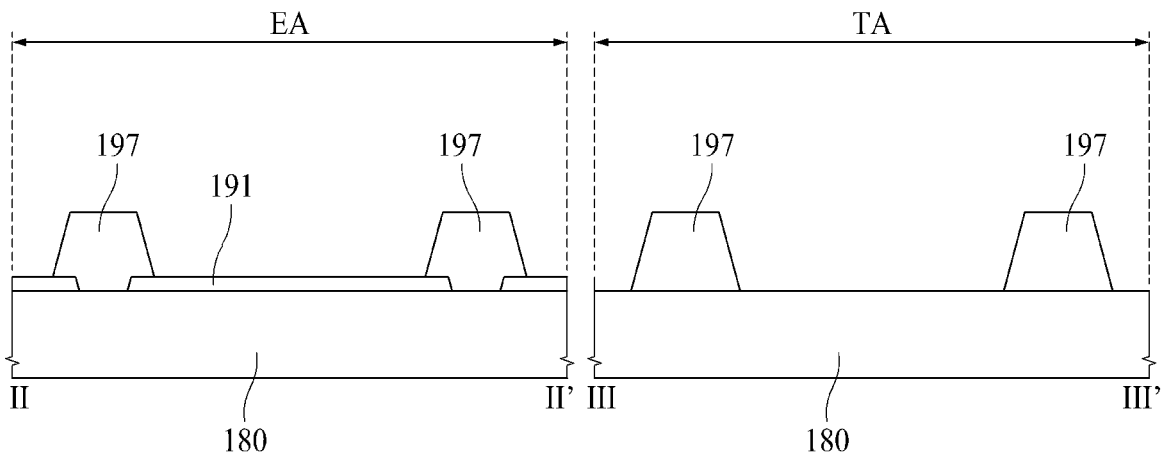

Referring to the left drawing of FIG. 11D, the first photoresist material 198*a* of the light emitting area EA is removed, and the bank material 197 is formed in a regular tapered shape. Referring to the right drawing of FIG. 11D, the bank material 197 is formed in a regular tapered shape by removing the first photoresist material 198*a* of the transparent area TA.

Figure 11E:
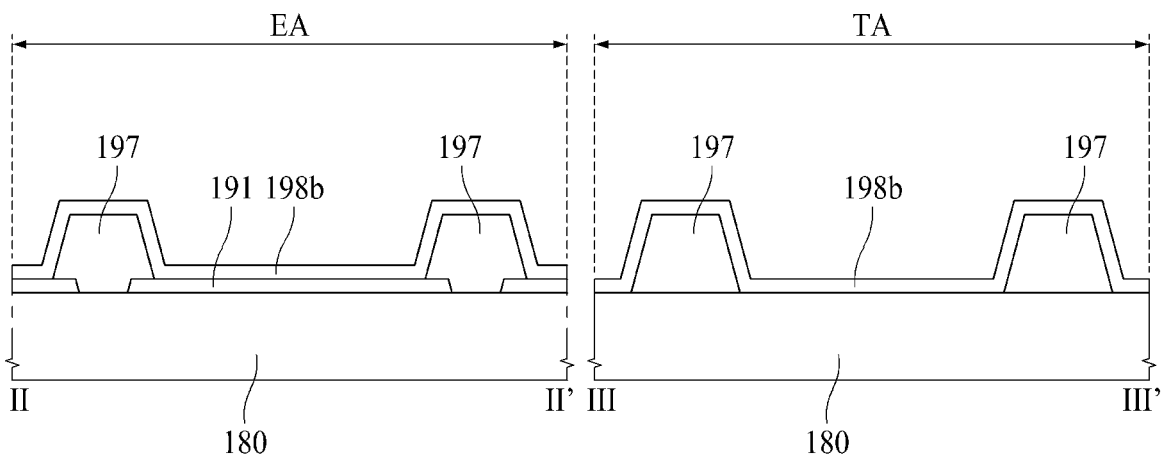

Referring to the left drawing of FIG. 11E, the second photoresist material 198*b* is deposited on the bank material 197 from which the first photoresist material 198*a* of the light emitting area EA has been removed. Referring to the right drawing of FIG. 11E, the second photoresist material 198*b* is deposited on the bank material 197 from which the first photoresist material 198*a* of the transparent area TA has been removed.

Figure 11F:
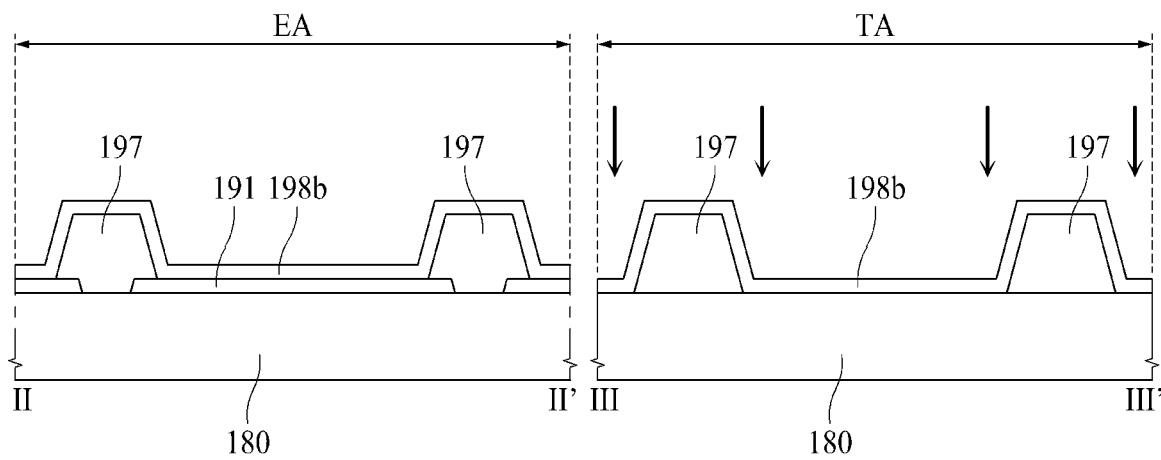

Referring to the left view of FIG. 11F, exposure is not performed on the second photoresist material 198*b* of the light emitting area EA. Referring to the right view of FIG. 11F, an exposure step on the second photoresist material 198*b* of the transparent area TA is included.

Figure 11G:
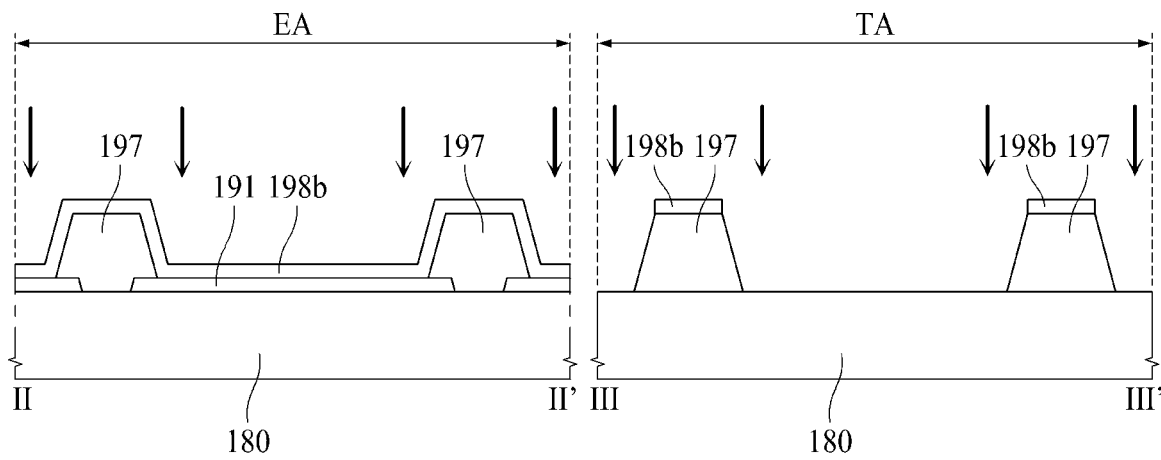

Referring to the left view of FIG. 11G, the second photoresist material 198*b* of the light emitting area EA is not patterned. Referring to the right drawing of FIG. 11G, the second photoresist material 198*b* of the transparent area TA is patterned.

Figure 11H:
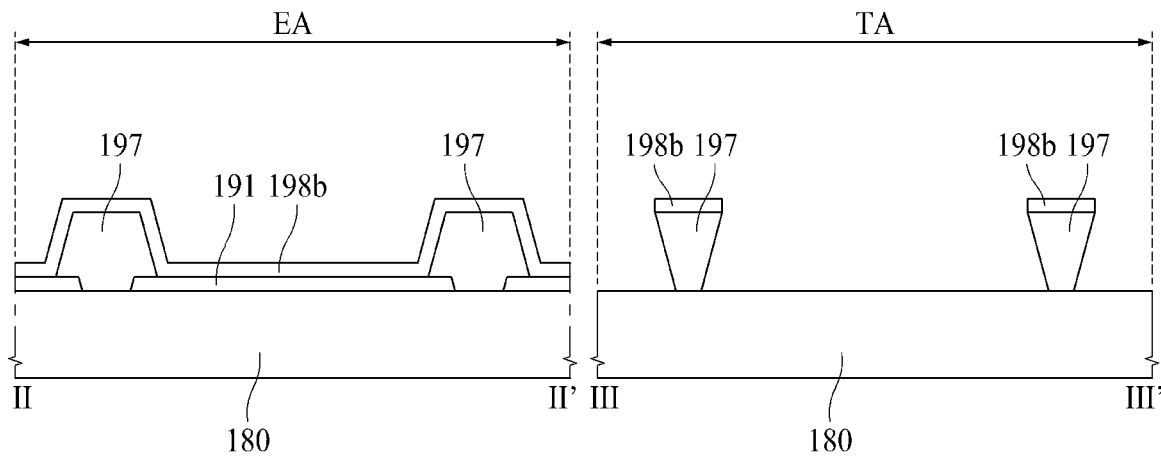

Referring to the right drawing of FIG. 11H, the bank material 197 of the transparent area TA is etched to form the bank material 197 in an inverted tapered shape.

Figure 11I:
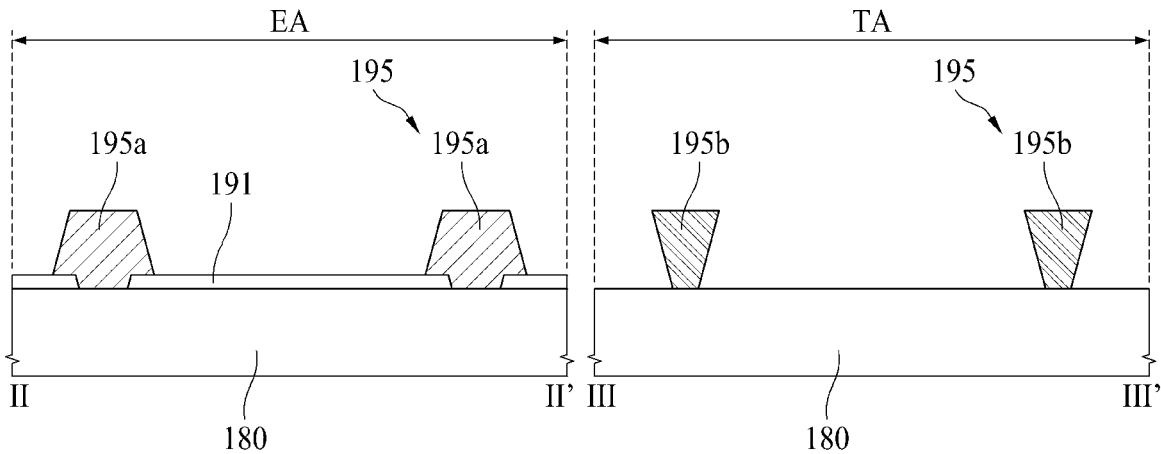

Referring to the left drawing of FIG. 11I, the second photoresist material 198*b* of the light emitting area EA is removed to form a first bank layer 195*a* in the form of a regular tapered shape. Referring to the right drawing of FIG. 11I, the second photoresist material 198*b* of the transparent area TA is removed to form a second bank layer 195*b* in the form of an inverted tapered shape.

Figure 11J:
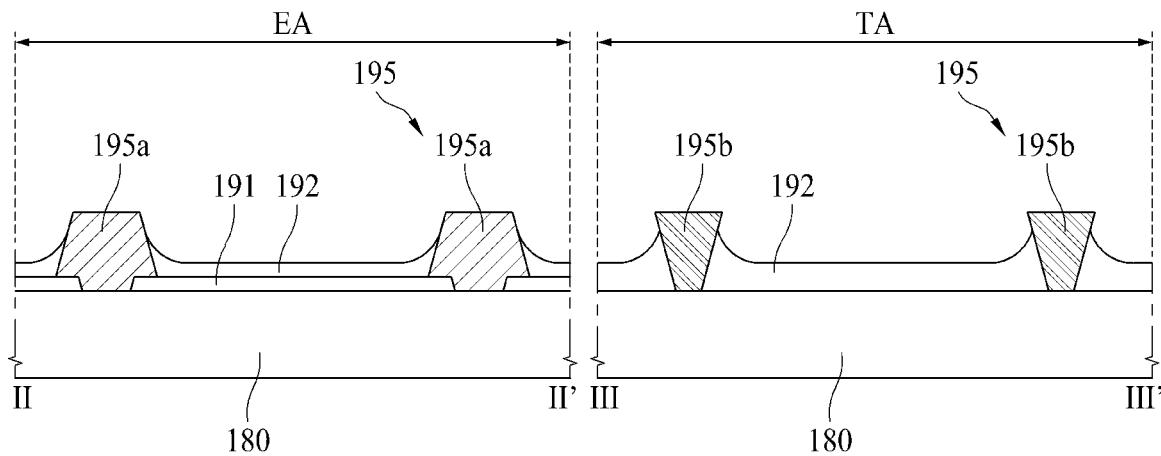

Referring to the left view of FIG. 11J, an organic light emitting unit 192 is formed on the first electrode 191. Referring to the right drawing of FIG. 11J, an organic light emitting unit 192 is formed on the planarization layer 180.

Figure 11K:
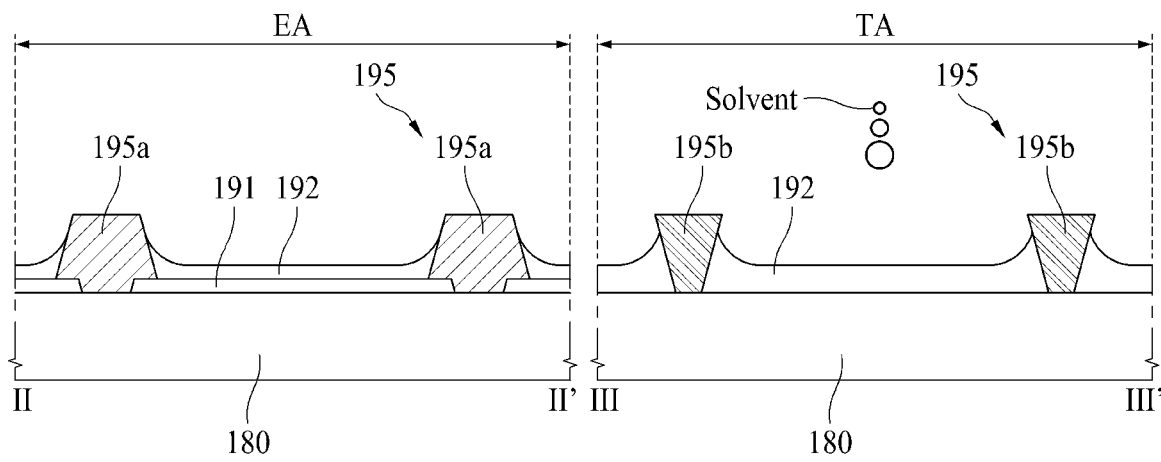

Referring to the right drawing of FIG. 11K, a solvent is added on the organic light emitting unit 192 on the right drawing of FIG. 11K but not the left drawing of FIG. 11K. That is, the solvent is added to the organic light emitting unit 192 in the transparent area TA without adding the solvent to the organic light emitting unit 192 in the light emitting area EA.

Figure 11L:
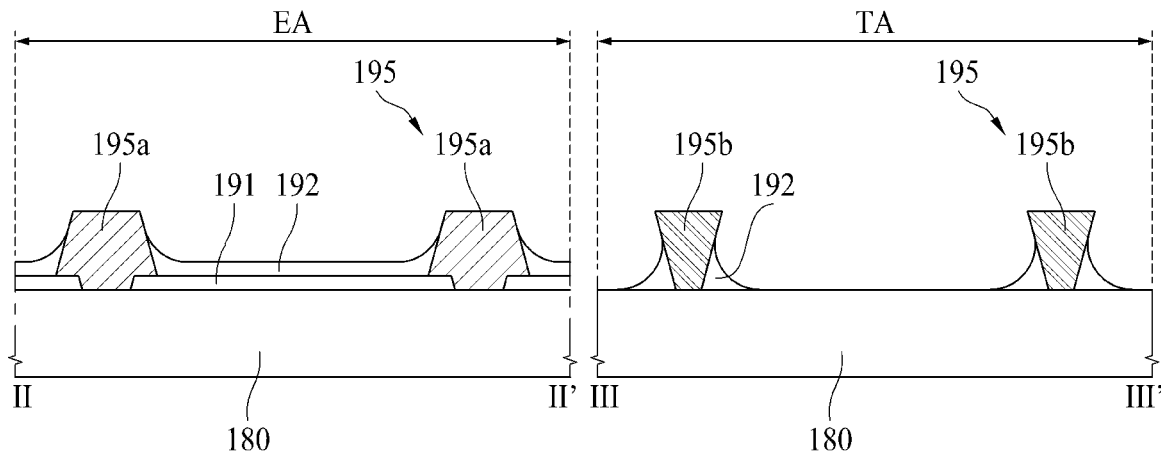

Referring to the right drawing of FIG. 11L, the organic light emitting unit 192 to which the solvent is added is vapored, and the planarization layer 180 in the transparent area TA is exposed from the organic light emitting unit 192.

Figure 11M:
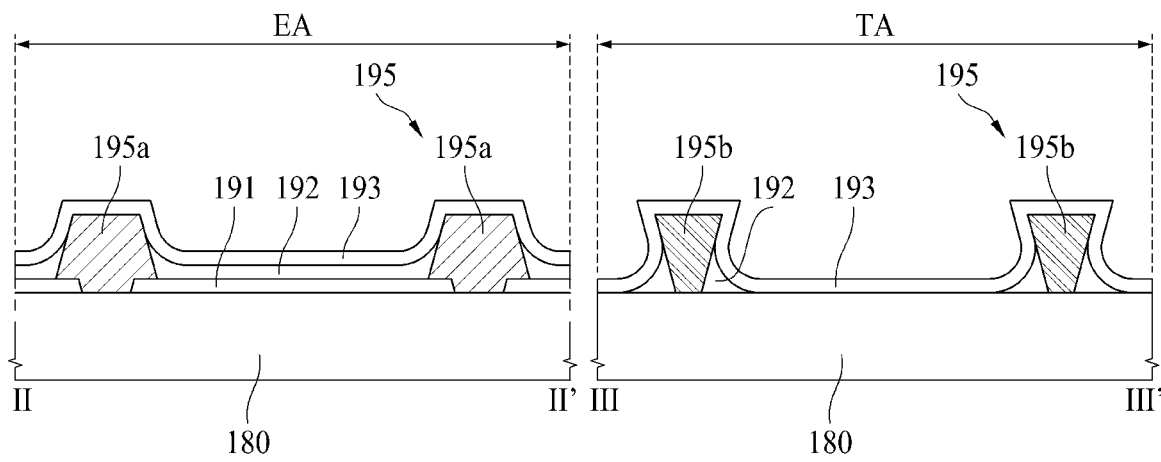

Referring to the left drawing of FIG. 11M, a second electrode 193 is formed on the first bank layer 195*a* and the organic light emitting unit 192 of the light emitting area EA. Referring to the right drawing of FIG. 11M, a second electrode 193 is formed on the second bank layer 195*b* and the planarization layer 180 of the transparent area TA.

Figure 12A:
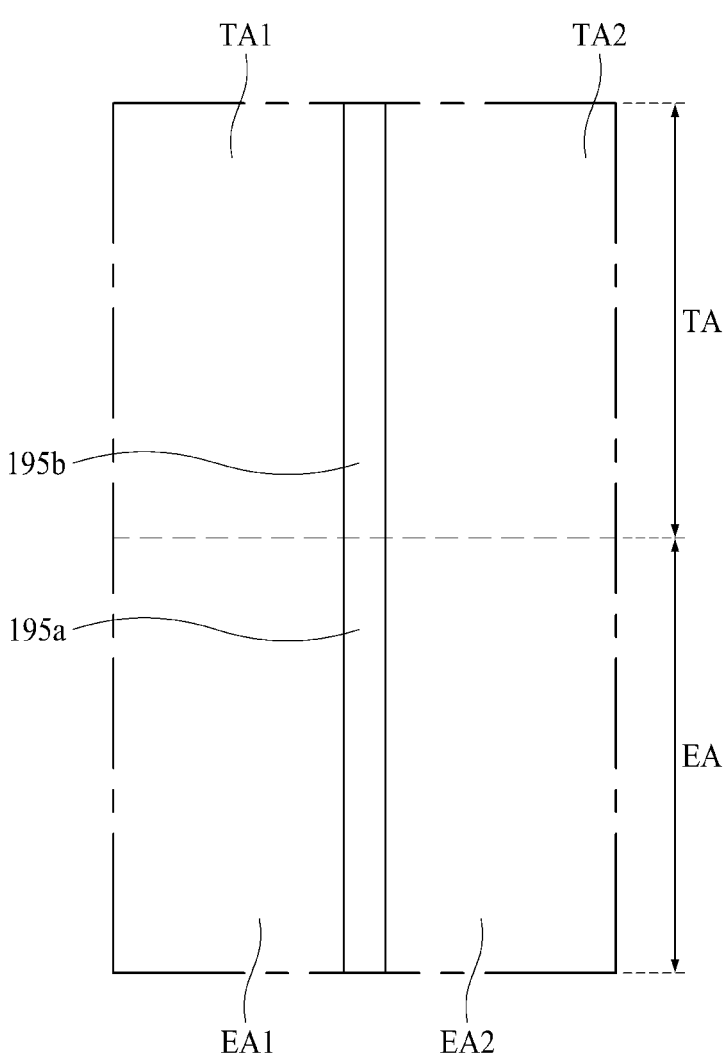
FIGS. 12A to 12C are process diagrams of a step of forming a bank layer of FIG. 2 according to an embodiment of the present disclosure.
Figure 12B:
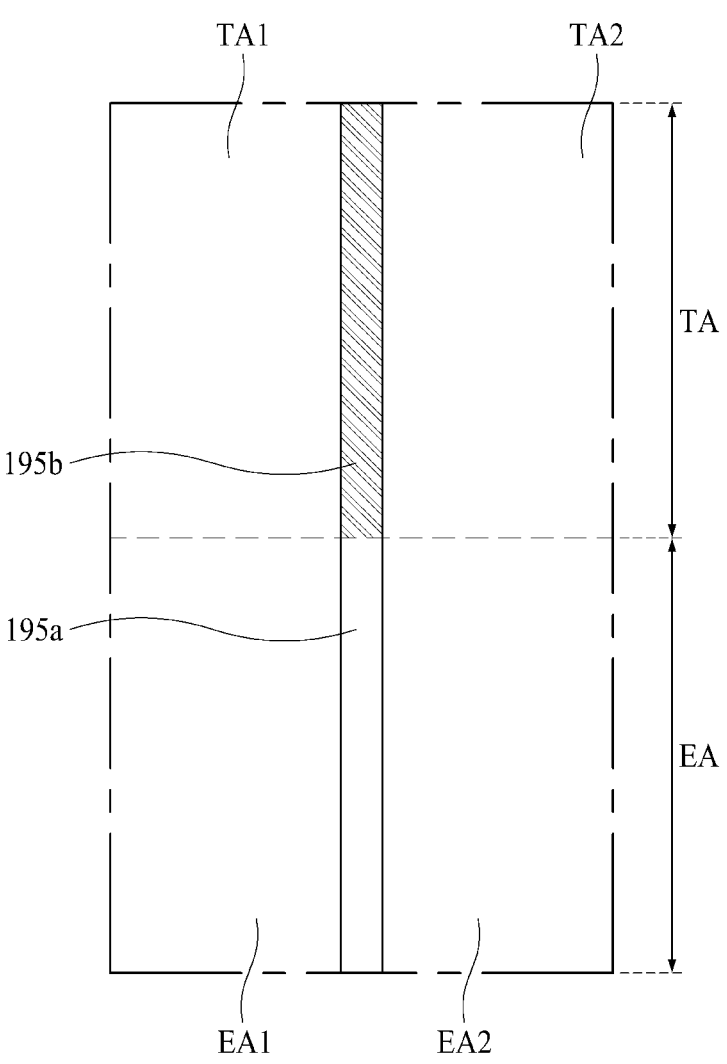
Figure 12C:
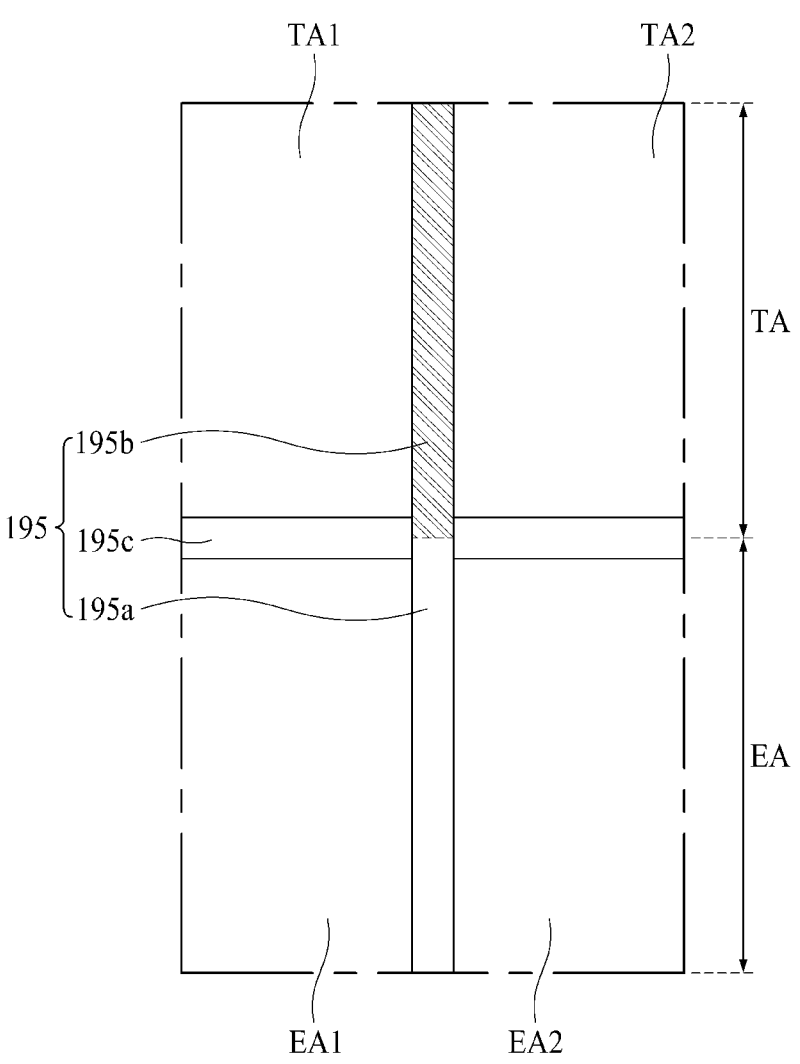

FIGS. 12A to 12C are process diagrams of a step of forming a bank layer 195 according to an embodiment of FIG. 2 of the present disclosure. In this case, FIGS. 12A to 12C illustrate a plan view of a step of forming a bank layer 195 according to an embodiment of FIG. 2 of the present disclosure. In addition, the bank layer 195 formed by FIGS. 12A to 12C may include the first bank layer 195*a*, the second bank layer 195*b*, and the third bank layer 195*c* of FIGS. 4 to 6. In this case, the bank layer 195 formed in FIGS. 12A to 12C has a single layer structure.

Referring to FIG. 12A, a first bank layer 195*a* with a regular tapered shape is formed on the light emitting area EA, and a second bank layer 195*b* with a regular tapered shape is formed on the transparent area TA. In this case, the first bank layer 195*a* and the second bank layer 195*b* having a regular tapered shape are formed through the manufacturing process of FIGS. 11A to 11D. In addition, the first bank layer 195*a* and the second bank layer 195*b* may have hydrophobicity.

Referring to FIG. 12B, a second bank layer 195*b* having an inverted tapered shape is formed on the transparent area TA. In this case, the second bank layer 195*b* having an inverted tapered shape is formed through the manufacturing process of FIGS. 11E to 11I.

Referring to FIG. 12C, a third bank layer 195*c* is formed in a region overlapping the boundary between the transparent area TA and the light emitting area EA. In this case, the third bank layer 195*c* has a tapered shape, which is formed through the manufacturing process of FIGS. 11A to 11D. In addition, the third bank layer 195*c* may have hydrophilicity.

According to an embodiment of the present disclosure, a step of forming a transparent layer 196 between a step of forming a bank layer 195 and a step of forming an organic light emitting unit 192 may be further included.

FIGS. 13A to 13F are process diagrams of a step of forming a transparent layer according to an embodiment of the present disclosure. The cross-sections of FIGS. 13A to 13F correspond to the cross-sectional views of V-V' of FIG. 9.

Figure 13A:
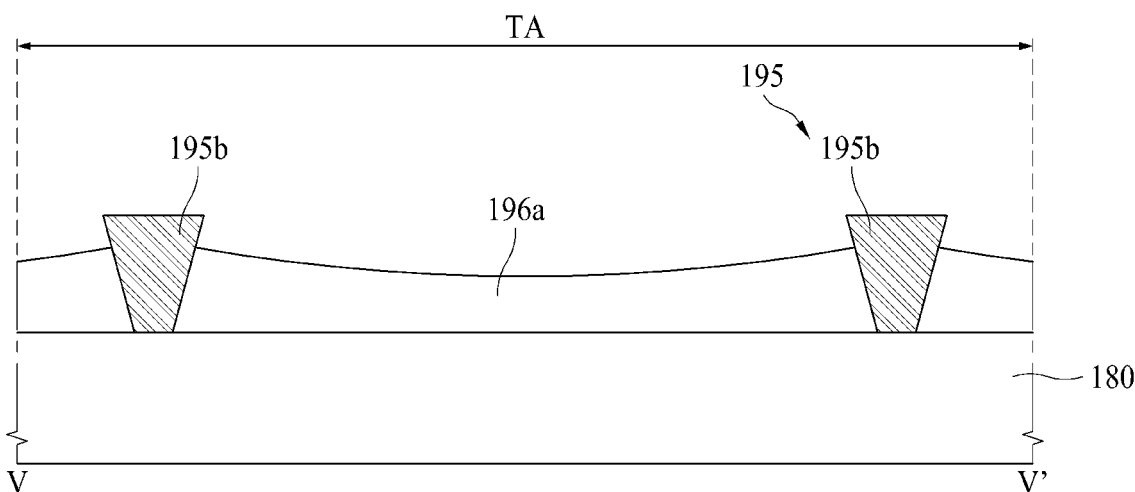
FIGS. 13A to 13F are process diagrams of a step of forming a transparent layer of FIG. 9 according to still another embodiment of the present disclosure.

Referring to FIG. 13A, a transparent layer material 196a is added on the planarization layer 180 of the transparent area TA. The transparent layer material 196a may be stacked on the transparent area TA and may include a material having a high light transmittance rate.

Figure 13B:
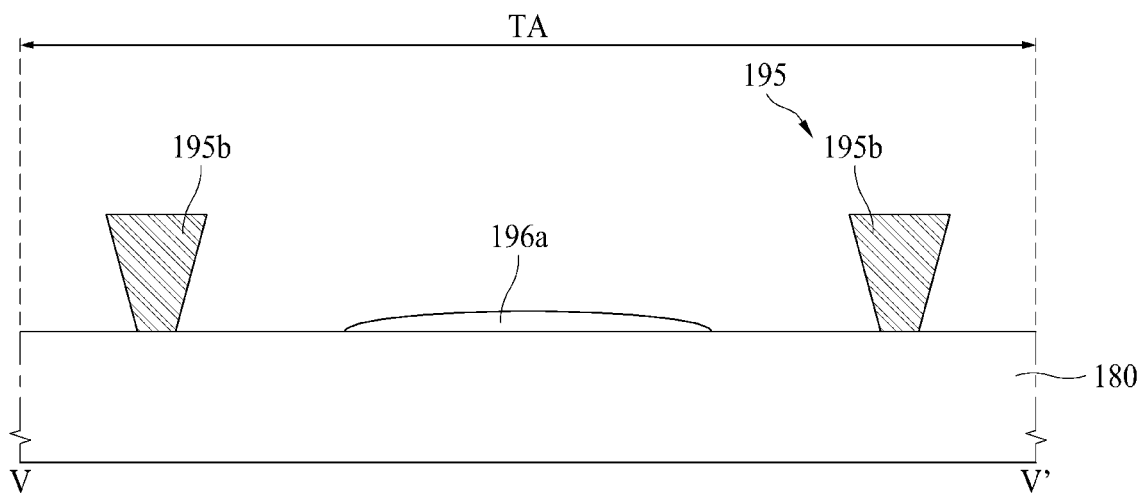

Referring to FIG. 13B, vacuum drying of the transparent layer material 196a disposed on the planarization layer 180 is performed.

Figure 13C:
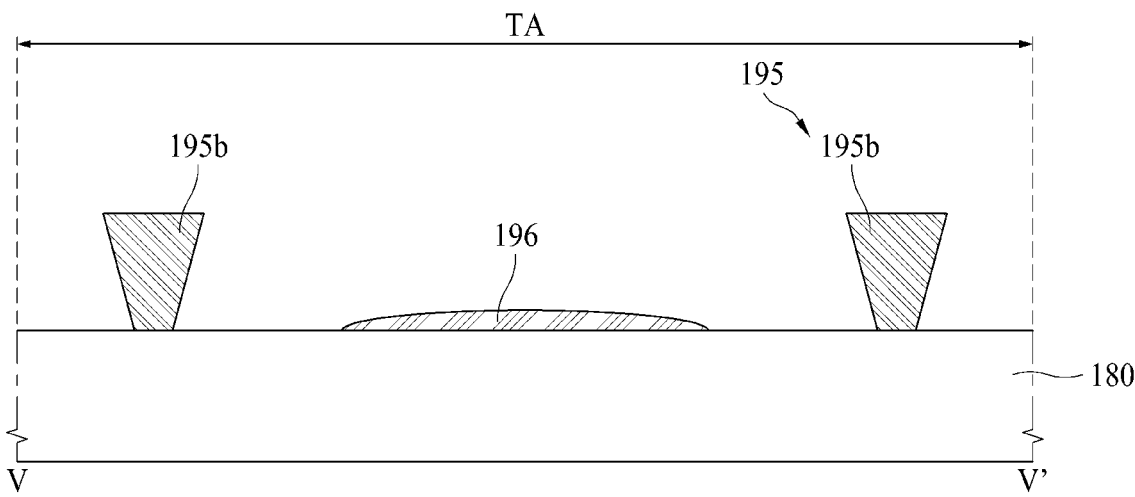

Referring to FIG. 13C, the dried transparent layer material 196a is baked. A transparent layer 196 is formed through the processes of FIGS. 13A to 13C.

Figure 13D:
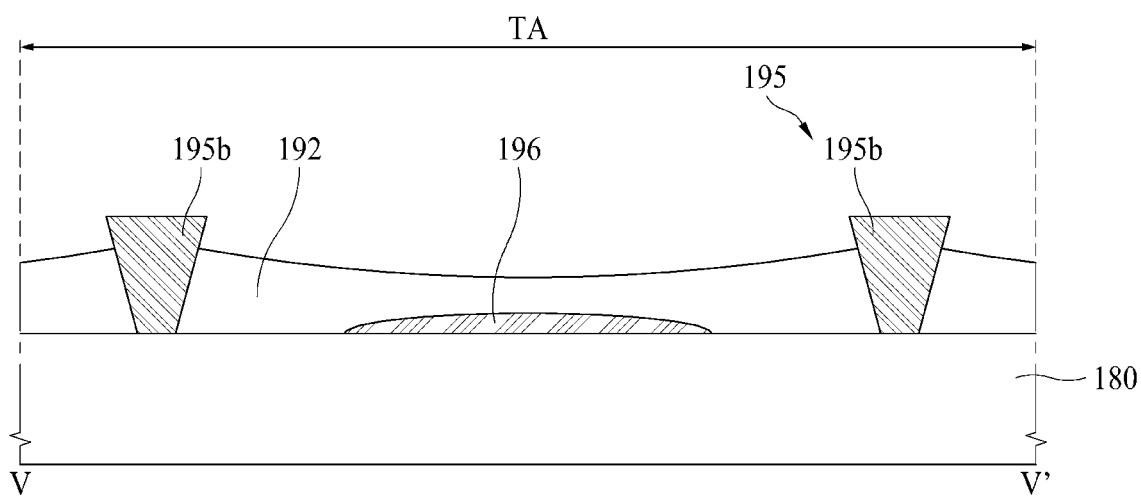

Referring to FIG. 13D, an organic light emitting unit 192 is formed on the manufactured transparent layer 196.

Figure 13E:
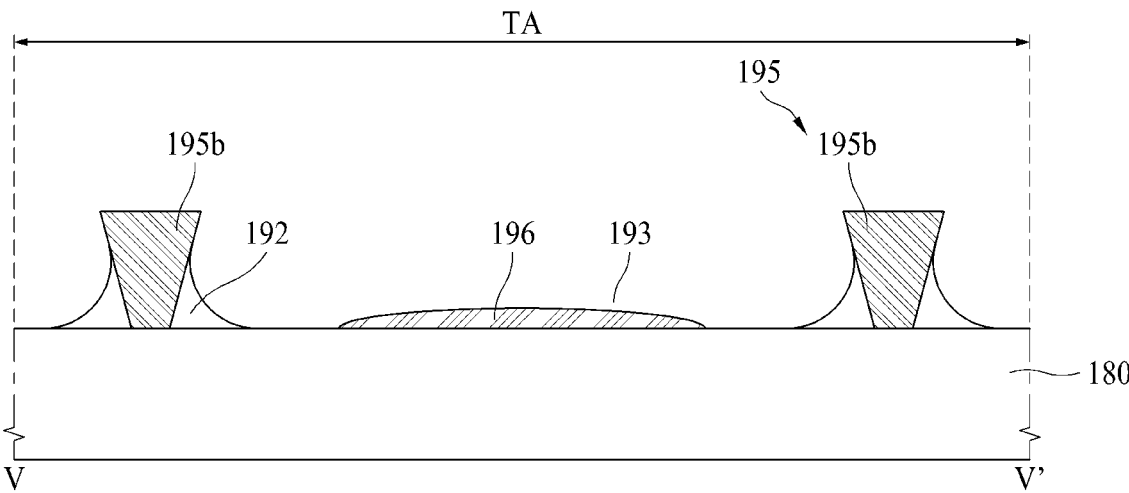

According to FIG. 13E, a solvent is added to the organic light emitting unit 192 and the planarization layer 180 is exposed from the organic light emitting unit 192 through a vaporing process. Refer to FIGS. 11K and 11L for the vaporing process.

Figure 13F:
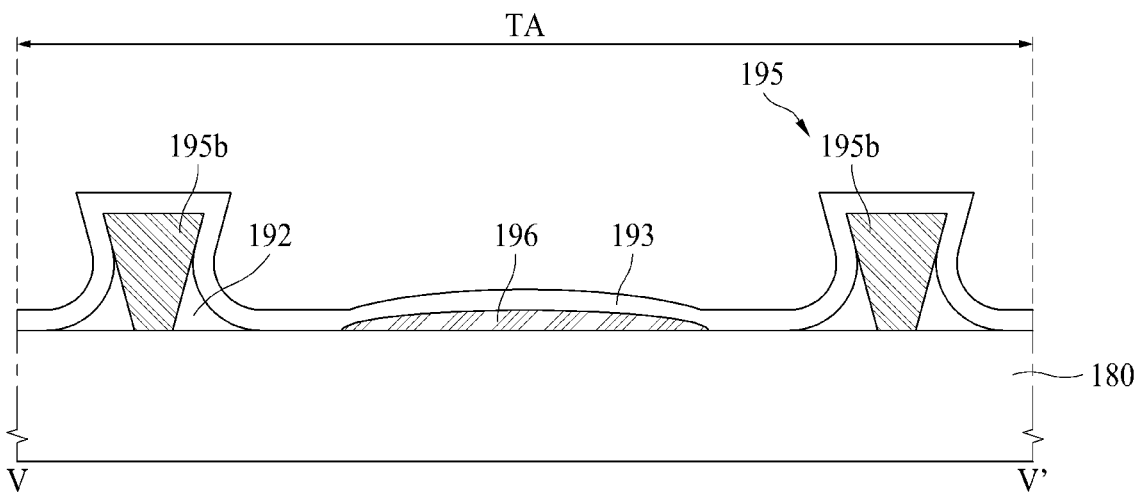

According to FIG. 13F, a second electrode 193 is formed on the organic light emitting unit 192, the second bank layer 195b, and the transparent layer 196.

According to an embodiment of this disclosure, since the transparent layer material 196a includes a large amount of liquid solvent, vacuum drying and baking processes are required to stabilize the layer by volatilizing the solvent contained in the transparent layer material 196a, and strengthening the crosslinking therein. The transparent layer 196 is formed through vacuum drying and baking processes.

According to an embodiment of the present disclosure, a solvent may be added to the organic light emitting unit 192 to remove the organic light emitting unit 192 through a vaporing process to expose the planarization layer 180. As a result, the organic light emitting unit 192 disposed in the transparent area TA may be removed, thereby the transmittance or aperture ratio of the transparent area TA is improved.

According to an embodiment of the present disclosure, the solvent added to the organic light-emitting unit 192 may include at least one of 4-ethylene glycol, DEGBE(diethylene glycol monobuytyl ether), TEGME(triethylene glycol monomethyl ether), DEGEE(diethylene glycol monoethyl ether), TPGME(Tri(propylene glycol) methyl ether), TEG (tetraethylene glycol), EGHE(ethylene glycol monohexyl ether), DPGPE(diproylene glycol mono-n-propylether), DEGBME(diethylene glycol monobutyl ether), 1-PH-2-Pol, carvacrol, 3-MBAol(3-methoxybutyl acetate), TEGEE(triethylene glycol monoethyl ether), TEGIPE(triethylene glycol monoisopropyl ether), TTEGME(Tetraethylene glycol monomethyl ether), and DEGHE(Diethylene glycol monohexyl ether).

According to the present disclosure, the following advantageous effects may be obtained.

According to an embodiment of this disclosure, the transparent display apparatus and a manufacturing method thereof can improve the light transmittance rate or aperture rate of the transparent area by forming a hydrophilic bank layer at the boundary between the transparent area and the light emitting area.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A transparent display apparatus comprising:
    a substrate including a transparent area and a light emitting area, the light emitting area including:
        a first bank layer;
        a first light emitting cell in contact with a first side of the first bank layer; and
        a second light emitting cell in contact with a second side of the first bank layer, the first light emitting cell and the second light emitting cell spaced apart from each other with the first bank layer interposed between the first light emitting cell and the second light emitting cell,
    the transparent area including:
        a second bank layer;
        a first transparent cell in contact with a first side of the second bank layer; and
        a second transparent cell in contact with a second side of the second bank layer, the first transparent cell and the second transparent cell spaced apart from each other with the second bank layer interposed between the first transparent cell and the second transparent cell,
    wherein the transparent display apparatus further comprising a third bank layer overlapping a boundary between the transparent area and the light emitting area, the first bank layer and the third bank layer having a tapered shape, and the second bank layer having an inverted tapered shape.

2. The transparent display apparatus of claim 1, wherein the first bank layer includes hydrophobic material.

3. The transparent display apparatus of claim 1, wherein the second bank layer includes hydrophobic material.

4. The transparent display apparatus of claim 1, wherein the third bank layer includes hydrophilic material.

5. The transparent display apparatus of claim 1, wherein the first bank layer and the second bank layer are disposed in a straight line with each other in a plan view of the transparent display apparatus.

6. The transparent display apparatus of claim 1, wherein the third bank layer includes a plurality of parts and the first bank layer and the second bank layer are interposed between the plurality of parts in a plan view of the transparent display apparatus.

7. The transparent display apparatus of claim 1, wherein the light emitting area includes a first electrode, a first organic light emitting unit on the first electrode, and a first portion of a second electrode on the first organic light emitting unit.

8. The transparent display apparatus of claim 7, wherein the transparent area includes a second organic light emitting unit and a second portion of the second electrode, the second portion of the second electrode connected to the first portion of the second electrode in the light emitting area.

9. The transparent display apparatus of claim 8, further comprising:
    a thin film transistor on the substrate;
    a planarization layer on the thin film transistor, and
    at least a part of the second portion of the second electrode in the transparent area is in contact with the planarization layer.

10. The transparent display apparatus of claim 1, further comprising:

a transparent layer in the transparent area but not in the light emitting area.

11. The transparent display apparatus of claim 1, wherein the first bank layer includes a first layer and a second layer on the first layer, the first layer includes a hydrophilic material, and the second layer includes hydrophobic material.

12. The transparent display apparatus of claim 1, wherein the second bank layer includes a first layer and a second layer on the first layer, the first layer includes a hydrophilic material, and the second layer includes hydrophobic material.

13. A transparent display apparatus comprising:

a substrate including a light emitting area and a transparent area, the transparent area more transparent than the light emitting area with respect to external light passing through the transparent area of the substrate and the external light passing through the light emitting area of the substrate;

a transistor on the substrate;

a planarization layer on the transistor, the planarization layer disposed in the transparent area and the light emitting area;

a bank layer on the planarization layer at a boundary between the light emitting area and the transparent area;

a first electrode in the light emitting area, the first electrode electrically connected to the transistor;

a first organic light emitting unit on the first electrode in the light emitting area;

a second organic light emitting unit in the transparent area, the second organic light emitting unit in contact with a portion of the bank layer in the transparent area and in contact with a first portion of the planarization layer in the transparent area; and a second electrode including a first portion of the second electrode that is on the first organic light emitting unit in the light emitting area and a second portion of the second electrode on the second organic light emitting unit in the transparent area and in contact with a second portion of the planarization layer in the transparent area.

14. The transparent display apparatus of claim 13, wherein the first portion of the second electrode and the second portion of the second electrode are electrically connected to each other.

15. The transparent display apparatus of claim 13, wherein the second electrode overlaps an upper surface of the bank layer.

16. The transparent display apparatus of claim 13, wherein the bank layer comprises a hydrophilic material.

17. A transparent display apparatus comprising:

a substrate including a transparent area and a light emitting area;

a plurality of first bank layers that are spaced apart from each other in the light emitting area, the plurality of first bank layers having a first shape;

a light emitting cell between the plurality of first bank layers in the light emitting area, the light emitting cell configured to emit light in the light emitting area;

a plurality of second bank layers that are spaced apart from each other in the transparent area, the plurality of second bank layers having a second shape that is different from the first shape of the plurality of first bank layers; and a transparent cell between the plurality of second bank layers in the transparent area.

18. The transparent display apparatus of claim 17, further comprising:

a third bank layer at a boundary between the transparent area and the light emitting area, the third bank layer having the first shape.

19. The transparent display apparatus of claim 18, wherein the first shape comprises a tapered shape and the second shape comprises an inverted tapered shape.

20. The transparent display apparatus of claim 18, wherein the plurality of first bank layers and the plurality of second bank layers include hydrophobic material and the third bank layer includes hydrophilic material.

21. The transparent display apparatus of claim 17, wherein the light emitting cell includes a first electrode, a first organic light emitting unit on the first electrode, and a first portion of a second electrode on the first organic light emitting unit, and the transparent cell includes a second organic light emitting unit and a second portion of the second electrode, the second portion of the second electrode electrically connected to the first portion of the second electrode.

22. The transparent display apparatus of claim 21, further comprising:

a planarization layer in the light emitting area and the transparent area, wherein the second organic light emitting unit contacts a first portion of the planarization layer in the transparent area, and the second portion of the second electrode contacts a second portion of the planarization layer in the transparent area.

* * * * *